(12) United States Patent
van Bentum et al.

(10) Patent No.: US 9,412,600 B2
(45) Date of Patent: Aug. 9, 2016

(54) METHOD OF FORMING A SEMICONDUCTOR STRUCTURE INCLUDING A FERROELECTRIC MATERIAL AND SEMICONDUCTOR STRUCTURE INCLUDING A FERROELECTRIC TRANSISTOR

(71) Applicant: GLOBALFOUNDRIES Inc., Grand Cayman (KY)

(72) Inventors: Ralf van Bentum, Moritzburg (DE); Gunter Grasshoff, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/471,812

(22) Filed: Aug. 28, 2014

(65) Prior Publication Data

US 2016/0064228 A1 Mar. 3, 2016

(51) Int. Cl.
*H01L 21/28* (2006.01)
*H01L 27/22* (2006.01)
*H01L 29/51* (2006.01)
*H01L 21/8234* (2006.01)

(52) U.S. Cl.
CPC .. *H01L 21/28291* (2013.01); *H01L 21/823437* (2013.01); *H01L 21/823462* (2013.01); *H01L 27/22* (2013.01); *H01L 29/516* (2013.01)

(58) Field of Classification Search
None
See application file for complete search history.

(56) References Cited

U.S. PATENT DOCUMENTS

| 2007/0029616 A1* | 2/2007 | Choi | H01L 21/823412 257/365 |
| 2010/0276757 A1* | 11/2010 | Doyle | H01L 21/82345 257/368 |
| 2013/0270619 A1 | 10/2013 | Schloesser et al. | |

* cited by examiner

*Primary Examiner* — Shaun Campbell
*Assistant Examiner* — Aneta Cieslewicz
(74) *Attorney, Agent, or Firm* — Amerson Law Firm, PLLC

(57) ABSTRACT

An illustrative method disclosed herein includes providing a semiconductor structure. The semiconductor structure includes a logic transistor region, a ferroelectric transistor region and an input/output transistor region. A first protection layer is formed over the semiconductor structure. The first protection layer covers the logic transistor region and the input/output transistor region. At least a portion of the ferroelectric transistor region is not covered by the first protection layer. After the formation of the first protection layer, a ferroelectric transistor dielectric is deposited over the semiconductor structure, the ferroelectric transistor dielectric and the first protection layer are removed from the logic transistor region and the input/output transistor region, an input/output transistor dielectric is formed over the input/output transistor region and a logic transistor dielectric is formed over at least the logic transistor region.

45 Claims, 21 Drawing Sheets

METHOD OF FORMING A SEMICONDUCTOR STRUCTURE INCLUDING A FERROELECTRIC MATERIAL AND SEMICONDUCTOR STRUCTURE INCLUDING A FERROELECTRIC TRANSISTOR

BACKGROUND OF THE INVENTION

1. Field of the Invention

The present disclosure relates to integrated circuits, and, in particular, to integrated circuits including transistors having a ferroelectric dielectric in addition to other transistors, such as logic transistors and/or input/output transistors.

2. Description of the Related Art

Integrated circuits typically include a large number of circuit elements which include, in particular, field effect transistors. The circuit elements in an integrated circuit may be electrically connected by means of electrically conductive metal lines formed in an interlayer dielectric material. The electrically conductive metal lines may be provided in a plurality of interconnect layers that are stacked on top of each other above a substrate in and on which circuit elements, such as field effect transistors, and other circuit elements, such as capacitors, diodes and resistors, are formed. Metal lines in different interconnect layers may be electrically connected with each other by means of contact vias that are filled with metal.

Integrated circuits may include nonvolatile memory. In some types of nonvolatile memory, so-called ferroelectric transistors (FeFETs) may be employed. Ferroelectric transistors may include a gate electrode that is formed above a channel region provided between a source region and a drain region. A layer of a ferroelectric material is arranged between the gate electrode and the channel region. An electrical conductivity of the channel region of the ferroelectric transistor may be controlled by an electrical field that acts on the channel region. In addition to an electrical field that is created by applying a gate voltage to the gate electrode of the ferroelectric transistor, an electrical field caused by a ferroelectric polarization of the layer of ferroelectric material arranged between the gate electrode and the channel region may also act on the channel region of the ferroelectric transistor.

Depending on the direction of the ferroelectric polarization of the ferroelectric dielectric, the electrical field created by the ferroelectric polarization of the ferroelectric dielectric may have a substantially same direction as the electrical field created by the application of the gate voltage to the gate electrode, or the electrical field created by the ferroelectric polarization of the ferroelectric dielectric and the electrical field created by the application of the gate voltage to gate electrode may have substantially opposite directions.

If both electrical fields have substantially the same direction, a threshold voltage that needs to be applied to the gate electrode for switching the ferroelectric transistor into the electrically conductive state (for ferroelectric transistors being N-channel transistors, the transistor is switched into the electrically conductive state by applying the gate voltage) may be reduced, and the electrical conductivity of the channel region that is obtained when a particular gate voltage greater than the threshold voltage is applied may be increased. If both electrical fields have opposite directions, the threshold voltage of the ferroelectric transistor may be increased, and the electrical conductivity of the channel region that is obtained when a particular gate voltage greater than the threshold voltage is applied may be reduced.

The ferroelectric polarization of the ferroelectric dielectric may be influenced by applying a programming voltage between the gate electrode and the channel region. For example, the programming voltage may be applied to the gate electrode, and the source region, the drain region and, optionally, the body of the ferroelectric transistor may be maintained at mass potential. The programming voltage may be positive or negative, depending on the desired direction of the ferroelectric polarization of the ferroelectric dielectric. The ferroelectric polarization of the ferroelectric dielectric may be maintained even if the programming voltage is no longer applied. Thus, a bit of data may be stored in the ferroelectric transistor, wherein a first polarization direction of the ferroelectric dielectric may be identified with a logical 0, and a second polarization direction of the ferroelectric dielectric may be identified with a logical 1.

For reading the stored bit of data from the ferroelectric transistor, a gate voltage may be applied between the gate electrode and the source region of the ferroelectric transistor, wherein the gate voltage applied during the reading of the bit of data is typically lower than the programming voltage, so that the ferroelectric polarization of the ferroelectric dielectric is substantially not changed. Then, the electric current flowing through the ferroelectric transistor may be measured for determining the direction of the ferroelectric polarization of the ferroelectric dielectric.

For some applications, it may be desirable to form ferroelectric transistors and field effect transistors of other types on a same semiconductor substrate. For example, U.S. Patent Publication No. 2013/0270619 discloses a method wherein a high-k dielectric layer is formed above a first active region and a second active region so as to serve as a ferroelectric layer. The high-k dielectric layer is removed from above the first active region. The high-k dielectric layer is preserved above the second active region. A first electrode structure is formed above the first active region and a second electrode structure is formed above the second active region.

The present disclosure provides semiconductor structures and methods for the manufacturing thereof which provide an improved integration of ferroelectric transistors on a same semiconductor structure as other types of transistors.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a logic transistor region, a ferroelectric transistor region and an input/output transistor region. A first protection layer is formed over the semiconductor structure. The first protection layer covers the logic transistor region and the input/output transistor region. At least a portion of the ferroelectric transistor region is not covered by the first protection layer. After the formation of the first protection layer, a ferroelectric transistor dielectric is deposited over the semiconductor structure, the ferroelectric transistor dielectric and the first protection layer are removed from the logic transistor region and the input/output transistor region, an input/output transistor dielectric is formed over the input/output transistor region, and a logic transistor dielectric is formed over at least the logic transistor region.

Another illustrative method disclosed herein includes providing a semiconductor structure. The semiconductor structure includes a logic transistor region, a ferroelectric transistor region and an input/output transistor region. A recess is formed in the ferroelectric transistor region. A ferroelectric transistor dielectric is deposited over the semiconductor structure. A portion of the ferroelectric transistor dielectric is deposited in the recess. The ferroelectric transistor dielectric is removed from the logic transistor region and the input/output transistor region. An input/output transistor dielectric is formed over the input/output transistor region. A logic transistor dielectric is formed over at least the logic transistor region.

An illustrative semiconductor structure disclosed herein includes a substrate. The substrate includes a logic transistor region, a ferroelectric transistor region and an input/output transistor region. A logic transistor is provided at the logic transistor region. The logic transistor includes a gate dielectric and a gate electrode. An input/output transistor is provided at the input/output transistor region. The input/output transistor includes a gate dielectric and a gate electrode. The gate dielectric of the input/output transistor has a greater thickness than the gate dielectric of the logic transistor. A ferroelectric transistor is provided at the ferroelectric transistor region. The ferroelectric transistor includes a recess in the ferroelectric transistor region. A ferroelectric dielectric is provided in the recess and a gate electrode is provided over the ferroelectric dielectric.

A further illustrative method disclosed herein includes providing a semiconductor structure. The semiconductor structure includes an input/output transistor region, a logic transistor region and a ferroelectric transistor region. An input/output transistor dielectric is provided over the input/output transistor region. A logic transistor dielectric is provided over at least the logic transistor region. A ferroelectric dielectric is provided over the ferroelectric transistor region. A layer of a gate electrode material is deposited over the semiconductor structure. A first gate electrode is formed over the ferroelectric transistor region. The formation of the first gate electrode includes performing a first gate etch process adapted to remove the gate electrode material. The first gate etch process partially removes a portion of the layer of gate electrode material over the ferroelectric transistor region. A second gate electrode is formed over the logic transistor region and a third gate electrode is formed over the input/output transistor region. The formation of the second gate electrode and the third gate electrode includes performing a second gate etch process. The second gate etch process partially removes a portion of the layer of gate electrode material over the logic transistor region and a portion of the layer of gate electrode material over the input/output transistor region. The first gate etch process and the second gate etch process are separate etch processes.

BRIEF DESCRIPTION OF THE DRAWINGS

The disclosure may be understood by reference to the following description taken in conjunction with the accompanying drawings, in which like reference numerals identify like elements, and in which.

Figure 1:
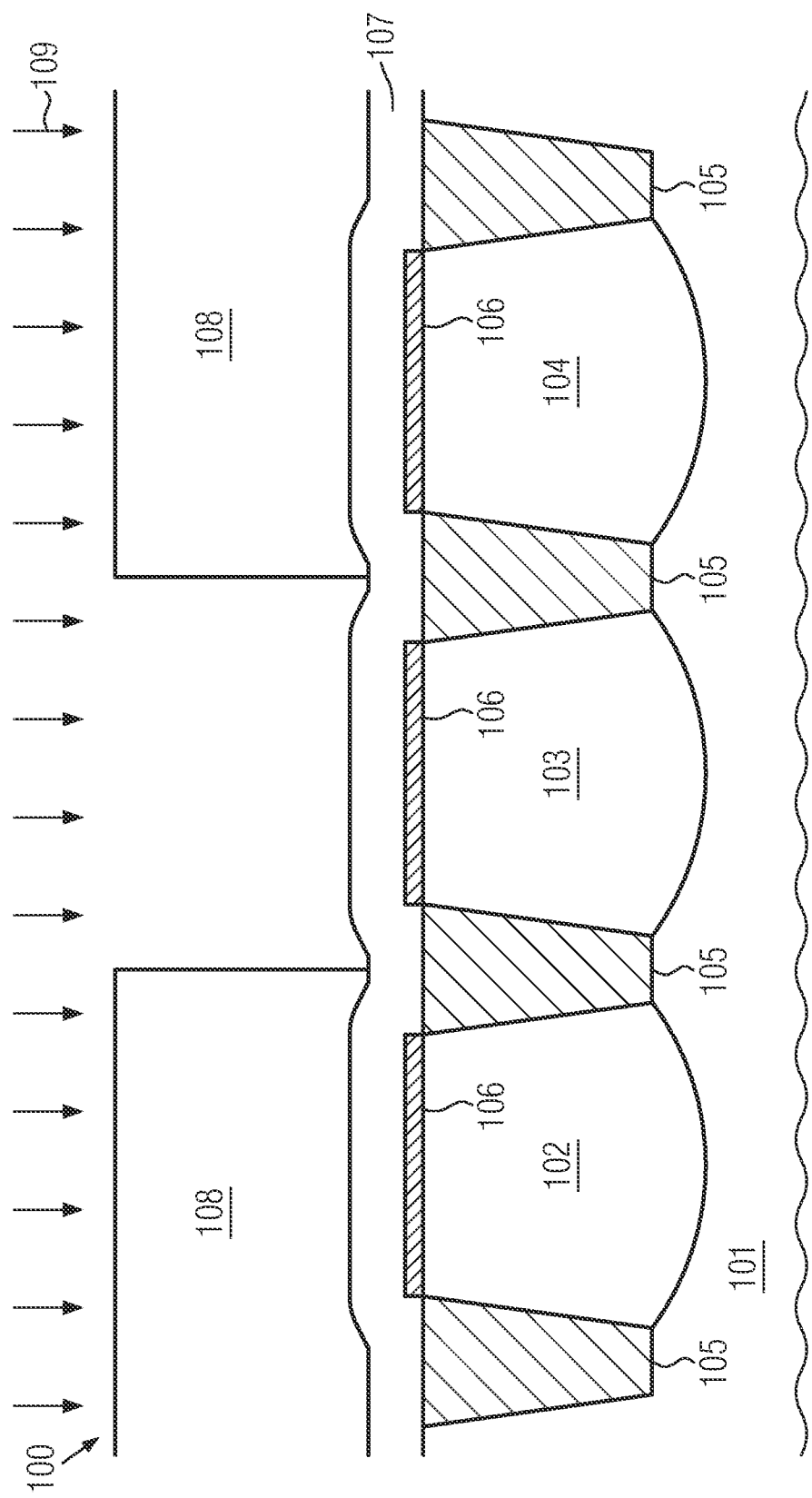
FIGS. 1-7 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments disclosed herein provide integration schemes for ferroelectric field effect transistors into a CMOS process, wherein logic transistors having a relatively thin gate dielectric and input/output transistors having a gate dielectric that has a greater thickness than the gate dielectric of the logic transistors are also formed. Accordingly, three different gate dielectrics can be formed on one semiconductor substrate such as, for example, a semiconductor wafer, wherein one of the gate dielectrics includes a ferroelectric material. Examples of possible applications include providing embedded memory wherein ferroelectric transistors are employed, as well as logic transistors and input/output transistors, on a same chip. Techniques as disclosed herein allow avoiding exposure of the gate dielectric of logic transistors to processing steps wherein the gate dielectric of ferroelectric transistors is formed. For logic transistors and input/output transistors, a same gate metal can be used, which may make it easier to etch the gate stack in the formation of gate electrodes of the logic transistors and the input/output transistors. The formation of the gate dielectrics of the logic transistors and the input/output transistors, as well as the work function engineering, may be performed in substantially the same manner as in conventional CMOS processes. Accordingly, the topography and the narrow width behavior of the logic transistors and the input/output transistors need not be altered significantly.

In some embodiments disclosed herein, a recess may be formed in a ferroelectric transistor region before a ferroelectric transistor dielectric is deposited therein. Thus, a topography during later processing steps, wherein photolithography processes are performed, may be reduced. In the absence of the formation of a recess at the ferroelectric transistor region, a topography whose magnitude depends on the thickness of the ferroelectric transistor dielectric may be obtained, wherein the magnitude may be in a range from about 10-30 nm. Typical focus margins for photolithography may be about ±30 nm. Hence, the topography obtained in the absence of the formation of the recess in the ferroelectric transistor region may result in a reduced focus margin, in particular for relatively thick ferroelectric transistor dielectrics having a thickness of more than about 20 nm. Forming a recess in the ferroelectric transistor region before the deposition of the ferroelectric transistor dielectric may allow substantially eliminating or at least reducing topography differences, which may help to increase a focus margin during photolithography and improve a yield of the manufacturing process. The reduction of the topography may also be beneficial in further processing steps other than photolithography, and it may help to provide an approximately same height of the gate electrodes in all transistors.

In some embodiments disclosed herein, a final gate etch for ferroelectric transistors may be separated from a final gate etch for other devices, such as logic transistors and input/output transistors. This may help to obtain good gate profiles for ferroelectric transistors, as well as logic transistors and input/output transistors, since issues caused by a high charging of the ferroelectric transistor regions due to the relatively thick ferroelectric transistor dielectric provided at the ferroelectric transistor regions may be avoided or at least substantially reduced.

FIG. 1 shows a schematic cross-sectional view of a semiconductor structure 100 according to an embodiment in a stage of a manufacturing process according to an embodiment. The semiconductor structure 100 includes a substrate 101. In some embodiments, the substrate 101 may be a bulk semiconductor substrate formed of a semiconductor material such as, for example, silicon. In other embodiments, the substrate 101 may be a semiconductor-on-insulator (SOI) substrate that includes a layer of a semiconductor material such as, for example, silicon, at which devices such as field effect transistors of the semiconductor structure 100 are formed, and which is provided on a layer of an insulating material such as, for example, silicon dioxide (not shown). The layer of insulating material may be provided on a support substrate which may, for example, be a silicon wafer (not shown).

The substrate 101 may include a logic transistor region 102, a ferroelectric transistor region 103 and an input/output transistor region 104. As will be detailed in the following, a logic transistor, being a field effect transistor which may be part of logical circuitry of the semiconductor structure 100, will be formed in the logic transistor region 102. In the ferroelectric transistor region 103, a ferroelectric transistor, being a field effect transistor including a gate insulation material including a ferroelectric material, will be formed. In the input/output transistor region 104, an input/output transistor of the semiconductor structure 100, being a field effect transistor that is configured for operation at a higher voltage of operation than the logic transistor to be formed in the logic transistor region 102, will be formed.

In some embodiments, each of the logic transistor region 102, the ferroelectric transistor region 103 and the input/output transistor region 104 may have a doping that is different from a base doping of the substrate 101. For example, in each of the logic transistor region 102, the ferroelectric transistor region 103 and/or the input/output transistor region 104, a respective well region may be provided. This may be done by means of conventional doping techniques, such as, for example, ion implantation. In other embodiments, well regions in the logic transistor region 102, the ferroelectric transistor region 103 and the input/output transistor region 104 may be provided in later steps of the manufacturing process, as will be detailed below.

The semiconductor structure 100 may further include a shallow trench isolation structure 105 that provides electrical insulation between the logic transistor region 102, the ferroelectric transistor region 103 and the input/output transistor region 104, and between the logic transistor region 102, the ferroelectric transistor region 103 and the input/output transistor region 104 and other circuit elements (not shown) in the semiconductor structure 100. For forming the shallow trench isolation structure 105, known techniques for providing shallow trench isolation structures, including photolithography, etching, oxidation, deposition and/or chemical-mechanical polishing, may be employed.

The semiconductor structure 100 further includes a pad layer 106. In some embodiments, the pad layer 106 may include silicon dioxide, and it may be formed by means of a thermal oxidation process and/or a deposition process, such as chemical vapor deposition (CVD) or plasma enhanced chemical vapor deposition (PECVD).

In some embodiments, the pad layer 106 may be formed before the formation of the shallow trench isolation structure 105. Thereafter, a pad nitride layer (not shown) may be formed on the pad layer 106. The pad nitride layer and the pad layer 106 may be patterned to form a hardmask, which may be used for etching the trenches of the shallow trench isolation structure 105. After the formation of the trenches, and after filling the trenches with an electrically insulating material, such as silicon dioxide, the pad nitride layer may be removed, and the pad layer 106 may remain on the surface of the semiconductor structure 100. In some embodiments, additional silicon dioxide may be grown or deposited after the formation of the shallow trench isolation structure 105 for increasing the thickness of the pad layer 106. This may help to ensure that the pad layer 106 has a sufficient thickness for use as an etch stop layer in later manufacturing processes, which will be described in detail below.

The semiconductor structure 100 further includes a first protection layer 107. The first protection layer 107 may be formed of a material that may be etched selectively with respect to the material of the pad layer 106. In particular, in embodiments wherein the pad layer 106 includes silicon dioxide, the first protection layer 107 may include silicon nitride. The first protection layer 107 may be formed by means of deposition processes such as CVD or PECVD.

The semiconductor structure 100 further includes a mask 108. The mask 108 may be a photoresist mask and may be formed by means of photolithography. The mask 108 covers the logic transistor region 102 and the input/output transistor region 104, but not the ferroelectric transistor region 103. Thus, a portion of the first protection layer 107 over the ferroelectric transistor region 103 is exposed at a surface of the semiconductor structure 100.

After the formation of the mask 108, an etch process adapted to selectively remove the material of the first protection layer 107 relative to the material of the pad layer 106 may be performed, as schematically denoted by arrows 109 in FIG. 1. In embodiments wherein the first protection layer 107 includes silicon nitride and the pad layer 106 includes silicon dioxide, the etch process 109 may be a wet or dry etch process adapted to selectively remove silicon nitride relative to silicon dioxide. The etch process 109 may remove the portion of the first protection layer 107 over the ferroelectric transistor region 103.

Figure 2:
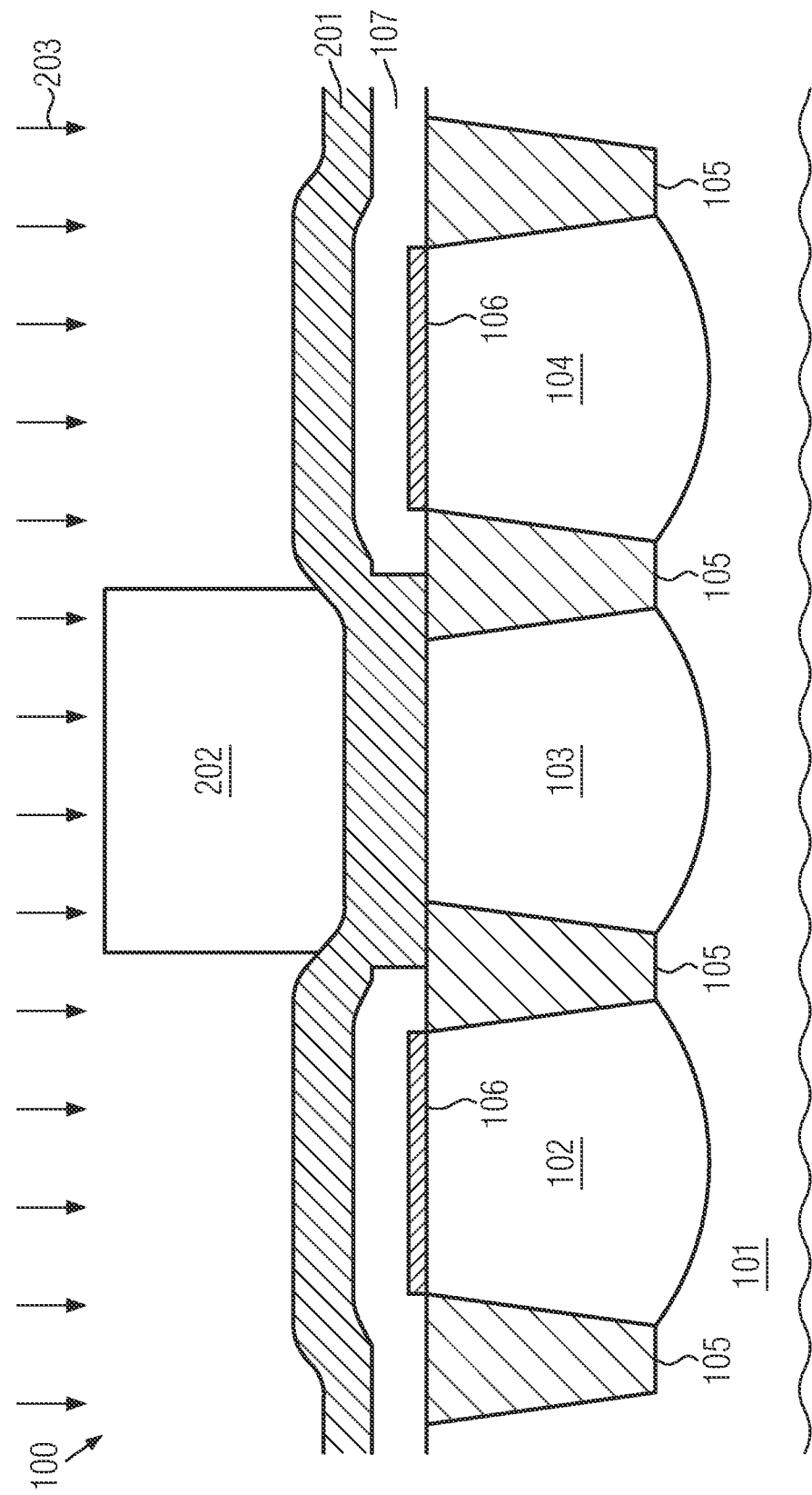

FIG. 2 shows a schematic cross-sectional view of the semiconductor structure 100 in a later stage of the manufacturing process. After the removal of the portion of the first protection layer 107 over the ferroelectric transistor region 103, the mask 108 may be removed by means of a resist strip process, and a further etch process, for example, a wet etch process, wherein diluted hydrofluoric acid is used, may be performed for removing the portion of the pad layer 106 over the ferroelectric transistor region 103. Thus, the semiconductor material of the substrate 101 is exposed at the surface of the semiconductor structure 100 in the ferroelectric transistor region 103.

Thereafter, a ferroelectric transistor dielectric 201 may be deposited over the semiconductor structure 100. In some embodiments, the ferroelectric transistor dielectric 201 may include a base dielectric (not shown) at the bottom of the ferroelectric transistor dielectric 201. The base dielectric may include silicon dioxide, silicon nitride or another dielectric, and it may help to improve an interface between the ferroelectric transistor dielectric 201 and the semiconductor material of the substrate 101 in the ferroelectric transistor region 103. Moreover, in some embodiments, the base dielectric may be used as an etch stop layer when portions of the ferroelectric transistor dielectric 201 are etched away from the semiconductor structure 100 as described below.

In some embodiments, the ferroelectric transistor dielectric 201 may include an oxide including hafnium. In some embodiments, the ferroelectric transistor dielectric 201 may include hafnium dioxide. The ferroelectric transistor dielectric 201 may be doped. For example, in some embodiments, the ferroelectric transistor dielectric 201 may include silicon-doped hafnium dioxide. Aluminum-doped hafnium dioxide, yttrium-doped hafnium dioxide, gadolinium-doped hafnium dioxide and/or hafnium zirconium dioxide may also be employed. In further embodiments, the ferroelectric transistor dielectric 201 may include substantially undoped hafnium dioxide.

Directly after the deposition of the ferroelectric transistor dielectric 201, the ferroelectric transistor dielectric 201 need not have ferroelectric properties. In some embodiments, the deposition process used for depositing the ferroelectric transistor dielectric may be adapted such that the deposited material is substantially amorphous, and a crystalline structure of the ferroelectric transistor dielectric 201 having ferroelectric properties may be obtained by means of an annealing process that is performed in a later stage of the manufacturing process, as will be described in more detail below.

In embodiments wherein the ferroelectric transistor dielectric 201 includes silicon-doped hafnium dioxide, an atomic layer deposition (ALD) process may be performed for depositing the ferroelectric transistor dielectric 201. In the atomic layer deposition process, tetrakis(ethylmethylamino)-hafnium, tetrakis-dimethylamino-silane and ozone may be employed. In some embodiments, metal organic precursors may additionally be used. The atomic layer deposition may be performed at a temperature of less than 500° C., for example at a temperature in a range from about 300-400° C., in particular at a temperature of about 350° C. A silicon content of the ferroelectric transistor dielectric 201 may be in a range from about 2-5 mol %, in particular in a range from about 2.5-4.5 mol %. The silicon dioxide content of the ferroelectric transistor dielectric 201 may be controlled by varying the composition of the gases employed in the atomic layer deposition process. Depositing the ferroelectric transistor dielectric 201 at a relatively low temperature as described above may help to obtain an amorphous structure of the as-deposited ferroelectric transistor dielectric 201.

In embodiments wherein the ferroelectric transistor dielectric 201 includes aluminum-doped hafnium dioxide, yttrium-doped hafnium dioxide or gadolinium-doped hafnium dioxide, an ALD process wherein tetrakis(ethylmethylamino) hafnium, hafnium tetrachloride as well as ozone and/or water are used may be employed. Furthermore, depending on whether the ferroelectric transistor dielectric 201 includes aluminum, yttrium or gadolinium, trimethylaluminum, tris(methylcyclopentadienyl)yttrium or tris(isopropylcyclopentadienyl)gadolinium may be used. Further parameters of the ALD process may correspond to those described above in the context of embodiments wherein the ferroelectric transistor dielectric 201 includes silicon-doped hafnium dioxide.

In embodiments wherein the ferroelectric transistor dielectric 201 includes hafnium zirconium dioxide, an ALD process wherein tetrakis(ethylmethylamino)zirconium, tetrakis(ethylmethylamino)hafnium and ozone are used may be performed for depositing the ferroelectric transistor dielectric 201. In some embodiments, the hafnium zirconium dioxide may have a composition in accordance with the formula $Hf_{0.5}Zr_{0.5}O_2$. Further parameters of the ALD process may correspond to those described above in the context of embodiments wherein the ferroelectric transistor dielectric 201 includes silicon-doped hafnium dioxide.

In embodiments wherein the ferroelectric transistor dielectric 201 includes substantially undoped hafnium dioxide, a CVD process or an ALD process may be used for forming the ferroelectric transistor dielectric 201, wherein materials and/or parameters corresponding to the embodiments described above are used but the substances provided for doping the ferroelectric transistor dielectric 201 are omitted.

The present disclosure is not limited to embodiments wherein an ALD process is used for depositing the ferroelectric transistor dielectric 201. In other embodiments, a physical vapor deposition (PVD) process, for example a sputtering process, may be employed.

A thickness of the ferroelectric transistor dielectric 201 may be in a range from about 10-30 nm.

Then, a mask 202 may be formed over the semiconductor structure 100. The mask 202 may be a photoresist mask, and it may be formed by means of a photolithography process. The mask 202 may cover the ferroelectric transistor region 103 but not the logic transistor region 102 and the input/output transistor region 104.

After the formation of the mask 202, one or more etch processes may be performed, as schematically denoted by arrows 203 in FIG. 2. In the one or more etch processes 203, portions of the ferroelectric transistor dielectric 201 over the logic transistor region 102 and the input/output transistor region 104 may be removed. Furthermore, the one or more etch processes 203 may remove the portions of the first protection layer 107 over the logic transistor region 102 and the input/output transistor region 104. Portions of the pad layer 106 over the logic transistor region 102 and the input/output transistor region 104 may remain in the semiconductor structure 100.

Figure 3:
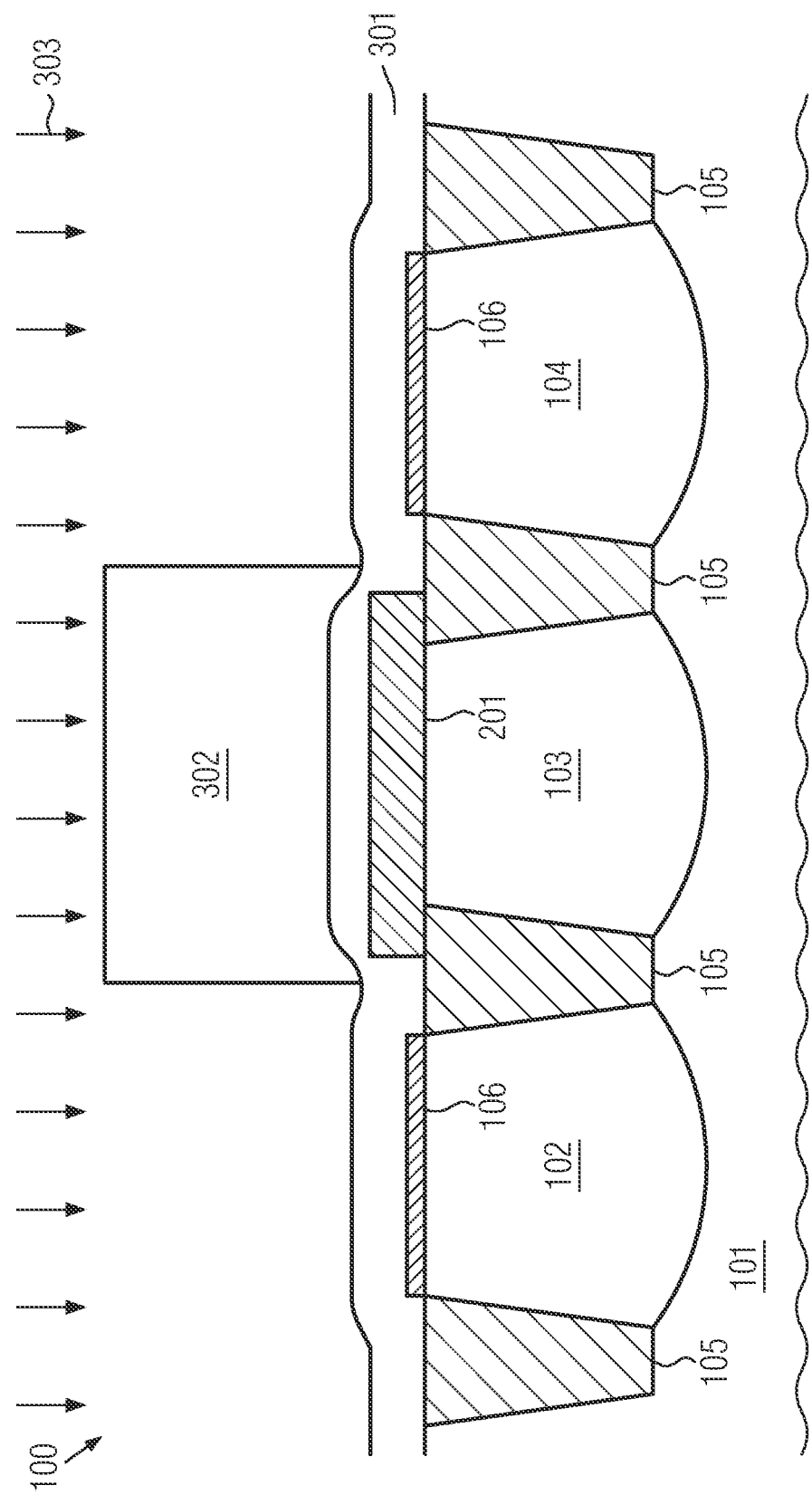

FIG. 3 shows a schematic cross-sectional view of the semiconductor structure 100 in a later stage of the manufacturing process. After the removal of portions of the ferroelectric transistor dielectric 201 and the first protection layer 107 over the logic transistor region 102 and the input/output transistor region 104, the mask 202 may be removed by means of a resist strip process, and a second protection layer 301 may be formed over the semiconductor structure 100. Similar to the first protection layer 107 described above, the second protection layer 301 may be formed of a material that may be etched selectively relative to the material of the pad layer 106, for example silicon nitride. For forming the second protection layer 301, deposition techniques such as CVD and PECVD may be employed.

After the formation of the second protection layer 301, a mask 302 may be formed over the second protection layer 301. The mask 302 may be a photoresist mask and it may be formed by means of a photolithography process. The mask 302 may cover the ferroelectric transistor region 103 but not the logic transistor region 102 and the input/output transistor region 104.

Then, an etch process may be performed, as schematically denoted by arrows 303 in FIG. 3. The etch process 303 may be a wet or dry etch process adapted to selectively remove the material of the second protection layer 301 relative to the material of the pad layer 106. In particular, in embodiments wherein the second protection layer 301 includes silicon nitride and the pad layer 106 includes silicon dioxide, the etch process 303 may be adapted to selectively remove silicon nitride relative to silicon dioxide. In some embodiments, the etch process 303 may be a wet etch process wherein hot phosphoric acid is used for selectively removing silicon nitride relative to silicon dioxide.

Thereafter, the mask 302 may be removed by means of a resist strip process, and an etch process adapted to selectively remove the material of the pad layer 106 relative to the material of the second protection layer 301 may be performed for removing the pad layer 106 from the logic transistor region 102 and the input/output transistor region 104. In embodiments wherein the pad layer 106 includes silicon dioxide and the second protection layer 301 includes silicon nitride, a wet etch process, wherein diluted hydrofluoric acid is used as an etchant, may be performed. Thus, the semiconductor material of the substrate 101 is exposed at the surface of the semiconductor structure 100 in the logic transistor region 102 and the input/output transistor region 104. The ferroelectric transistor region 103 remains covered by the ferroelectric transistor dielectric 201, and the ferroelectric transistor dielectric 201 over the ferroelectric transistor region 103 is encapsulated by the portion of the second protection layer 301 over the ferroelectric transistor region 103.

The present disclosure is not limited to embodiments wherein the portion of the ferroelectric transistor dielectric 201 over the ferroelectric transistor region 103 is encapsulated by the second protection layer 301. In other embodiments, the formation of the second protection layer 301 and the patterning of the second protection layer by means of the mask 302 and the etch process 303 may be omitted. In such embodiments, after the one or more etch processes 203 described above with reference to FIG. 2, the pad layer 106 may be removed from the logic transistor region 102 and the input/output transistor region 104, and the processing of the semiconductor structure 100 may be continued as described in the following.

Figure 4:
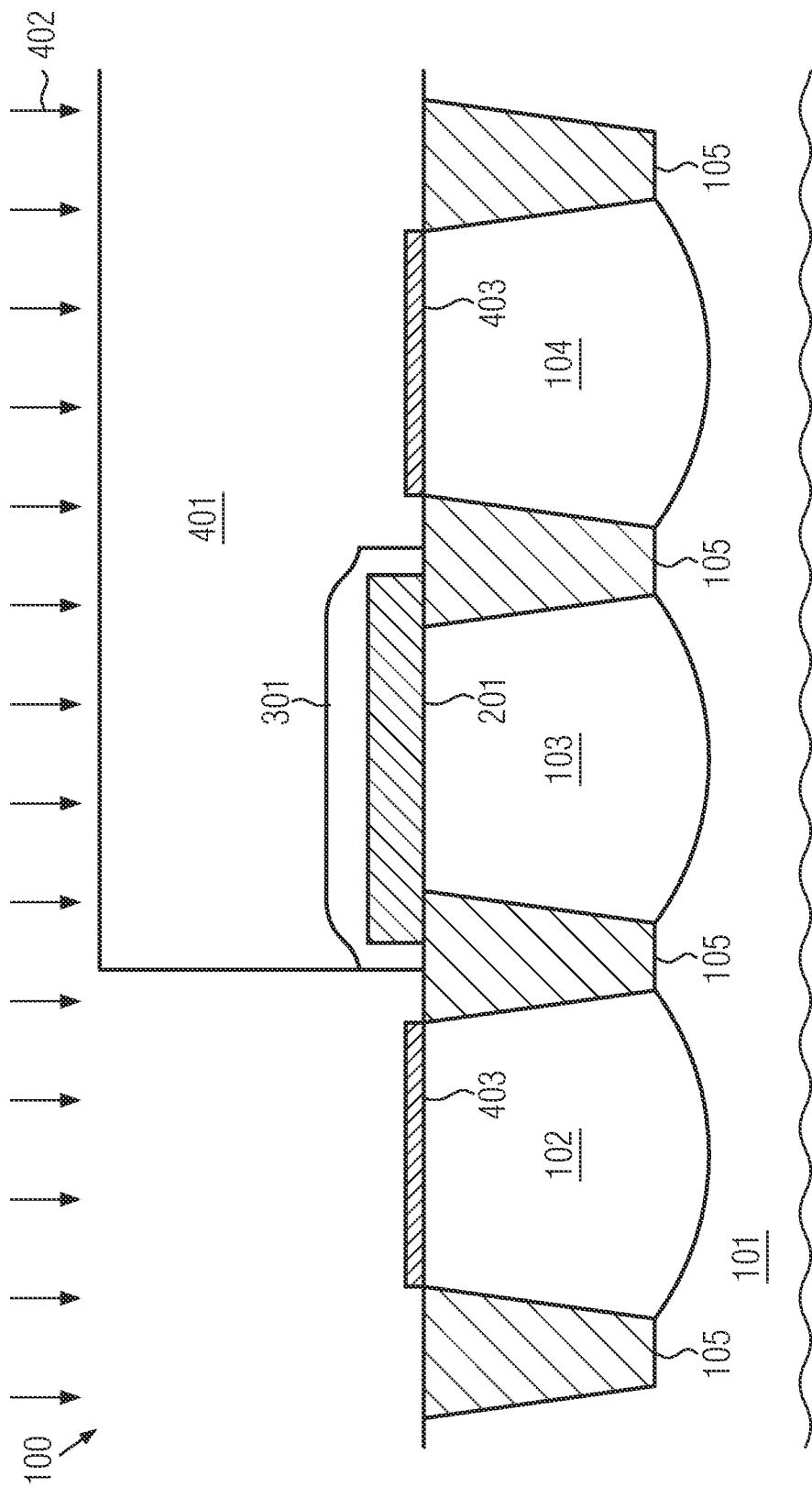

FIG. 4 shows a schematic cross-sectional view of the semiconductor structure 100 in a later stage of the manufacturing process. After the removal of the pad layer 106 from the logic transistor region 102 and the input/output transistor region 104, an input/output transistor dielectric 403 may be formed over the logic transistor region 102 and the input/output transistor region 104.

The input/output transistor dielectric 403 may include an electrically insulating material such as, for example, silicon dioxide, and may be formed by means of techniques such as, for example, thermal oxidation and/or deposition techniques such as CVD and/or PECVD. A thickness of the input/output transistor dielectric 403 may be adapted such that the input/output transistor dielectric 403 may be employed in a gate insulation layer of the input/output transistor to be formed in the input/output transistor region 104. For example, the input/output transistor dielectric 403 may be a silicon dioxide layer having a thickness of about 20 Å or more, in particular a thickness in a range from about 20-70 Å.

Thereafter, a mask 401 may be formed over the semiconductor structure 100. The mask 401 may be a photoresist mask, and it may be formed by means of photolithography. The mask 401 may cover the ferroelectric transistor region 103 and the input/output transistor region 104, but not the logic transistor region 102.

Then, an etch process adapted to selectively remove the material of the input/output transistor dielectric 403 may be performed, as schematically denoted by arrows 402 in FIG. 4. In embodiments wherein the input/output transistor dielectric 403 includes silicon dioxide, the etch process 402 may be a wet etch process wherein diluted hydrofluoric acid is used as an etchant.

Figure 5:
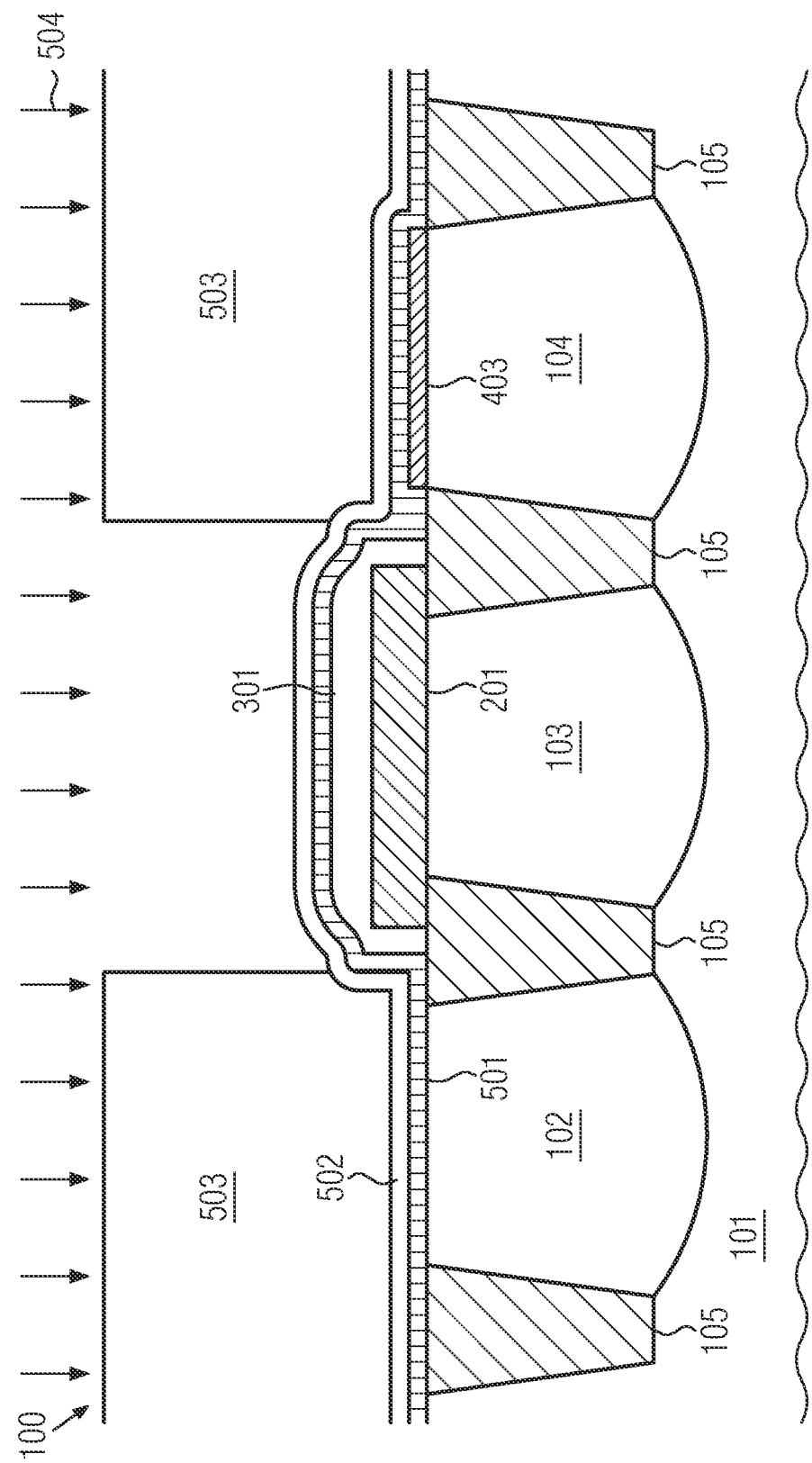

FIG. 5 shows a schematic cross-sectional view of the semiconductor structure 100 in a later stage of the manufacturing process. After the removal of the portion of the input/output transistor dielectric 403 over the logic transistor region 102, the mask 401 may be removed from the semiconductor structure 100 by means of a resist strip process, and a logic transistor dielectric 501 may be deposited over the semiconductor structure 100.

The logic transistor dielectric 501 may include a high-k dielectric material such as, for example, hafnium dioxide. In some embodiments, the logic transistor dielectric 501 may include a layer of high-k dielectric material that is provided on a base layer, which may include silicon dioxide, silicon nitride or a combination of silicon dioxide and silicon nitride. The logic transistor dielectric 501, when including a high-k dielectric material, need not include hafnium dioxide. In other embodiments, other high-k dielectric materials having a dielectric constant greater than a dielectric constant of silicon dioxide, for example a dielectric constant greater than about four, may be employed, such as, for example, zirconium dioxide, hafnium silicate and/or zirconium silicate.

For forming the logic transistor dielectric 501, deposition techniques such as, for example, CVD, PECVD, metal organic chemical vapor deposition and/or ALD may be employed for depositing the layer of high-k dielectric material. In embodiments wherein the logic transistor dielectric 501 additionally includes a base layer of silicon dioxide, the base layer may be formed by means of deposition techniques such as CVD and/or PECVD. In other embodiments, a base layer of silicon dioxide may be formed at the bottom of the logic transistor dielectric 501 at the logic transistor region 102 by means of a thermal oxidation process. At the input/output transistor region 104, this thermal oxidation process can create silicon dioxide at the bottom of the input/output transistor dielectric 403.

In later stages of the manufacturing process, which will be detailed below, a portion of the logic transistor dielectric 501 over the logic transistor region 102 will provide a gate insulation layer of the logic transistor formed at the logic transistor region 102, and portions of the input/output transistor dielectric 403, as well as the logic transistor dielectric 501 formed over the input/output transistor region 104, will provide a gate insulation layer of the input/output transistor formed at the input/output transistor region 104. The gate insulation layer of the input/output transistor can withstand greater voltages of operation, as applied to the input/output transistor in the operation of the integrated circuit formed from the semiconductor structure 100, than the gate insulation layer of the logic transistor that does not include the input/output transistor dielectric 403.

After the formation of the logic transistor dielectric 501, a first metal 502 may be deposited over the semiconductor structure 100. Herein, the term "metal" will generally be used to denote elementary metals, metal alloys and metal compounds. The first metal 502 may include a metal, a metal alloy and/or a metal compound suitable for use as a metal gate of the logic transistor to be formed at the logic transistor region 102 and the input/output transistor to be formed at the input/output transistor region 104. In embodiments wherein the logic transistor to be formed at the logic transistor region 102 and the input/output transistor to be formed at the input/output transistor region 104 are P-channel transistors, the first metal 502 may include aluminum and/or aluminum nitride. In embodiments wherein the logic transistor and the input/output transistor are N-channel transistors, the first metal 502 may include lanthanum, lanthanum nitride and/or titanium nitride.

The logic transistor and the input/output transistor need not be transistors of the same type. In some embodiments, one of the logic transistor and the input/output transistor may be an N-channel transistor, and the other of the logic transistor and the input/output transistor may be a P-channel transistor. In such embodiments, portions of the first metal 502 over the logic transistor region 102 and the input/output transistor region 104, respectively, may include different materials. In such embodiments, layers of different metals may subsequently be deposited over the semiconductor structure 100, and techniques of photolithography and etching may be employed for removing portions of the metal layers from the logic transistor region 102, the input/output transistor region 104 and, optionally, the ferroelectric transistor region 103.

After the formation of the first metal 502, an annealing process may be performed for obtaining a diffusion of the first metal 502.

Thereafter, a mask 503 may be formed over the semiconductor structure 100. The mask 503 may be a photoresist mask, and it may be formed by means of photolithography. The mask 503 may cover the logic transistor region 102 and the input/output transistor region 104, but not the ferroelectric transistor region 103.

Then, one or more etch processes 504 adapted to remove the materials of the first metal 502, the logic transistor dielectric 501 and the second protection layer 301 may be performed, as schematically denoted by arrows 504 in FIG. 5. The one or more etch processes 504 may remove the portions of the first metal 502 and the logic transistor dielectric 501 over the ferroelectric transistor region 103. Additionally, the one or more etch processes 504 may remove the second protection layer 301 from the ferroelectric transistor region 103, so that the ferroelectric transistor dielectric 201 is exposed at the surface of the semiconductor structure 100. In embodiments wherein the formation of the second protection layer 301 is omitted, as described above, only the first metal 502 and the logic transistor dielectric 501 need to be removed from the ferroelectric transistor region 103 for exposing the ferroelectric transistor dielectric 201. Thereafter, the mask 503 may be removed by means of a resist strip process.

Figure 6:
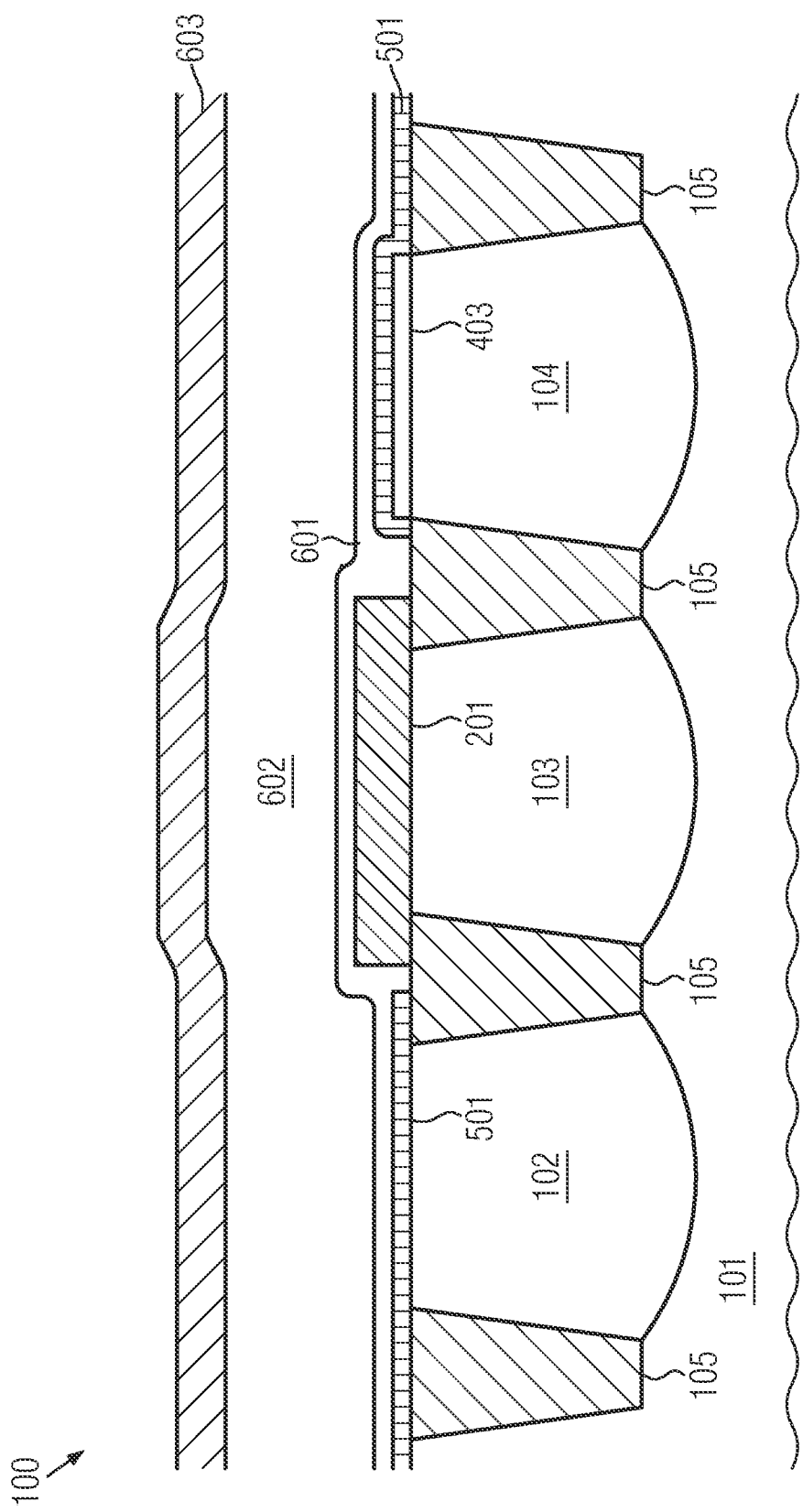

FIG. 6 shows a schematic cross-sectional view of the semiconductor structure 100 in a later stage of the manufacturing process. After exposing the portion of the ferroelectric transistor dielectric 201 over the ferroelectric transistor region 103, the first metal 502 may be removed from the logic transistor region 102 and the input/output transistor region 104. This may be done by means of an etch process adapted to selectively remove the first metal 502 relative to the materials of the logic transistor dielectric 501, the shallow trench isolation trench structure 105 and the ferroelectric transistor dielectric 201. The removal of the first metal 502 may be performed in the absence of any photoresist mask over the semiconductor structure 100.

Thereafter, a second metal 601 may be deposited over the semiconductor structure 100. The second metal 601 may include a metal or a metal compound, for example titanium nitride, and may be deposited by means of deposition techniques such as CVD, PECVD and/or ALD.

Thereafter, an annealing process may be performed, wherein the ferroelectric transistor dielectric 201 is annealed in the presence of the second metal 601 for obtaining a crystalline structure of the ferroelectric transistor dielectric 201 having ferroelectric properties. The annealing process may be a rapid thermal annealing process wherein the semiconductor structure 100 is exposed to a temperature that is greater than a crystallization temperature of the material of the ferroelectric transistor dielectric 201. In some embodiments, in the annealing process, the semiconductor structure 100 may be exposed to a temperature of more than about 450° C., in particular a temperature in a range from about 450-1000° C., a temperature in a range from about 500-1000° C. and/or a temperature of about 650° C.

Thereafter, a gate electrode material 602 and a hardmask material 603 may be deposited over the semiconductor structure 100. In some embodiments, the gate electrode material 602 may include polysilicon and/or amorphous silicon and the hardmask material 603 may include silicon nitride.

Figure 7:
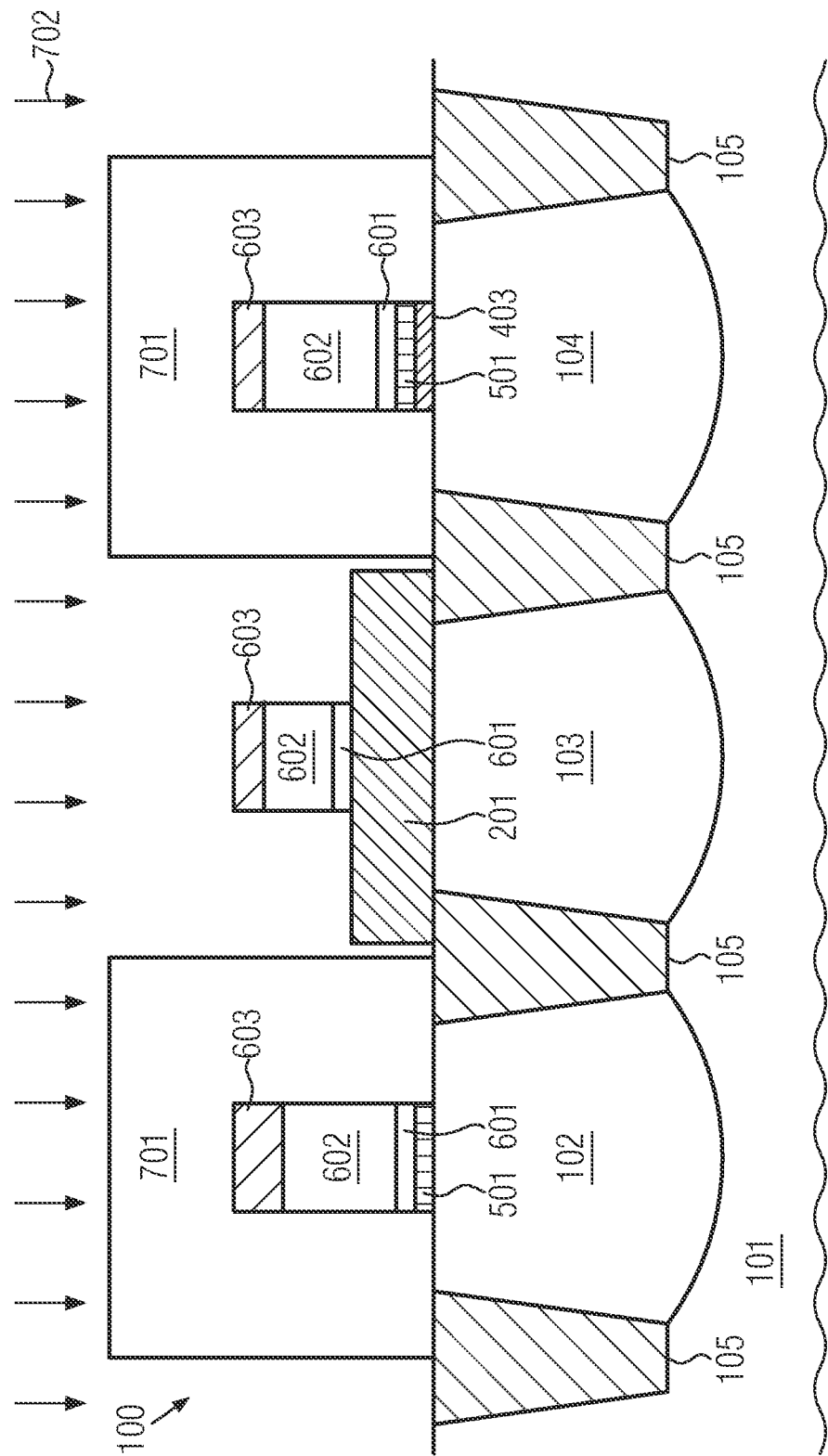

FIG. 7 shows a schematic cross-sectional view of the semiconductor structure 100 in a later stage of the manufacturing process. After the deposition of the hardmask material 603, the hardmask material 603 may be patterned for forming a hardmask. The hardmask may cover portions of the gate electrode material 602 over the logic transistor region 102, the ferroelectric transistor region 103 and the input/output transistor region 104, from which gate electrodes of the logic transistor to be formed at the logic transistor region 102, the ferroelectric transistor to be formed at the ferroelectric transistor region 103 and the input/output transistor to be formed at the input/output transistor region 104 will be formed, as detailed below. Further, portions of the hardmask may cover portions of the gate electrode material 602 from which polysilicon lines of the semiconductor structure 100 are to be formed (not shown).

For forming the hardmask from the hardmask material 603, techniques of photolithography and etching may be employed, wherein separate processes of photolithography and etching may be employed for forming portions of the hardmask used for the formation of polysilicon lines and portions of the hardmask used for forming gate electrodes over the logic transistor region 102, the ferroelectric transistor region 103 and the input/output transistor region 104. The formation of portions of the hardmask used for the formation of polysilicon lines may be performed before the formation of portions of the hardmask that are used for the formation of gate electrodes.

Thereafter, one or more etch processes may be performed for removing portions of the gate electrode material 602 over the logic transistor region 102, the ferroelectric transistor 103 and the input/output transistor region 104 which are not covered by the hardmask. Additionally, the one or more etch processes may remove portions of the second metal 601, the logic transistor dielectric 501 and the input/output transistor dielectric 403 which are not covered by the hardmask. However, in some embodiments, the one or more etch processes may stop at the ferroelectric transistor dielectric 201, so that portions of the ferroelectric transistor dielectric 201 which are not below the hardmask may remain on the semiconductor structure 100, as illustrated in FIG. 7.

For removing such portions of the ferroelectric transistor dielectric 201, a mask 701 may be formed over the semiconductor structure 100. The mask 701 may include a photoresist, and may be formed by means of a photolithography process. The mask 701 may cover the logic transistor region 102 and the input/output transistor region 104, but not the ferroelectric transistor region 103. Thereafter, an etch process adapted for selectively removing the ferroelectric transistor dielectric 201 relative to the hardmask material 603 may be performed, as schematically illustrated by arrows 702 in FIG. 7. The etch process 702 may remove portions of the ferroelectric transistor dielectric adjacent the gate electrode provided by the portion of the gate electrode material 602 covered by the hardmask over the ferroelectric transistor region 103.

In some embodiments, a protection liner (not shown), which may, for example, include a conformal layer of silicon nitride, may be deposited over the semiconductor structure 100 before the formation of the mask 701 and the etch process 702 for protecting the portion of the second metal 601 over the ferroelectric transistor region 103 from being affected by the etchant used in the etch process 702.

After the etch process 702, the mask 701 may be removed by means of a resist strip process, and further processes, including ion implantation processes for forming source regions and drain regions in each of the transistor regions 102, 103, 104, may be performed for completing the formation of a logic transistor in the logic transistor region 102, a ferroelectric transistor in the ferroelectric transistor region 103, and an input/output transistor in the input/output transistor region 104. These processes may be performed in accordance with conventional processes employed in the formation of field effect transistors in integrated circuits. In some embodiments, a mask (not shown) covering the logic transistor region 102 and the input/output transistor region 104, but not the ferroelectric transistor region 103, may be formed, and one or more ion implantation processes for forming halo and/or extension regions in the ferroelectric transistor region 103 may be performed for adjusting properties of the ferroelectric transistor.

In the embodiments described above, the logic transistor dielectric 501 from which the gate insulation layer of the logic transistor formed at the logic transistor region 102 is formed is not exposed to processing steps performed for forming the ferroelectric transistor dielectric. Thus, an alteration of properties of the gate insulation layer of the logic transistor (and also the input/output transistor formed at the input/output transistor region 104) may be substantially avoided.

In the following, further embodiments will be described with reference to FIGS. 8-12. For convenience, in FIGS. 1-7, on the one hand, and in FIGS. 8-12, on the other hand, like reference numerals are used to denote like components. Unless explicitly stated otherwise, components denoted by like reference numerals may have corresponding or similar features, and like or similar methods may be used for the formation thereof. Accordingly, a detailed description thereof will sometimes be omitted.

Figure 8:
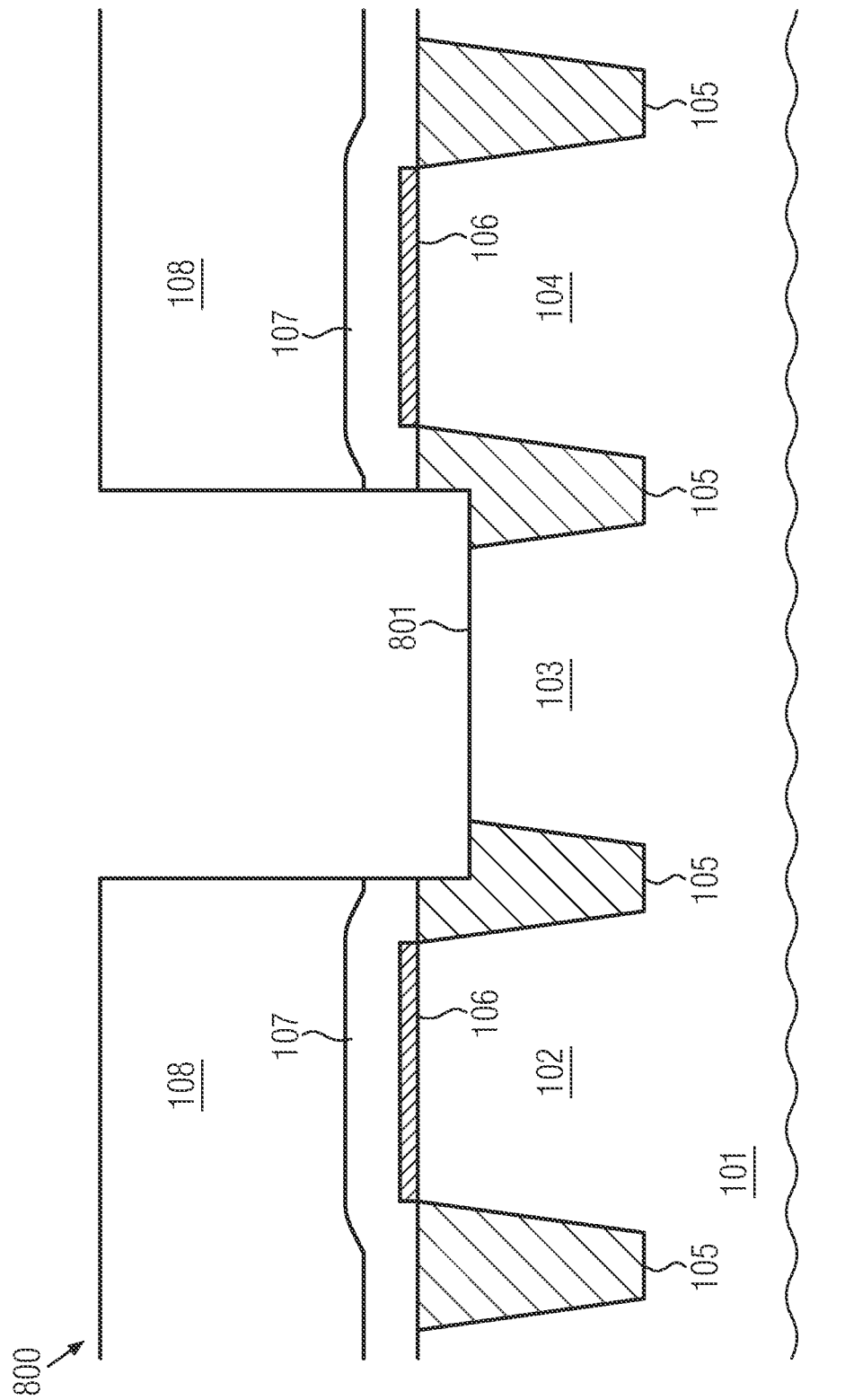
FIGS. 8-12 show schematic cross-sectional views of a semiconductor structure according to an embodiment in stages of a manufacturing process according to an embodiment.

FIG. 8 shows a schematic cross-sectional view of a semiconductor structure 800 according to an embodiment in a stage of a manufacturing process according to an embodiment. The semiconductor structure 800 includes a substrate 101. The substrate 101 includes a logic transistor region 102, a ferroelectric transistor region 103 and an input/output transistor region 104. Electrical insulation between the logic transistor region 102, the ferroelectric transistor region 103 and the input/output transistor region 104, as well as electrical insulation between the logic transistor region 102, the ferroelectric transistor region 103 and the input/output transistor region 104 and other circuit elements in the semiconductor structure 800, may be provided by a shallow trench isolation structure 105.

At the stage of the manufacturing process shown in FIG. 8, a doping of each of the logic transistor region 102, the ferroelectric transistor region 103 and the input/output transistor region 104 may be approximately equal to a base doping of the substrate 101. In particular, at this stage of the manufacturing process, no well regions having a doping that is different from the base doping of the substrate 101 need to be provided in the logic transistor region 102, the ferroelectric transistor region 103 and the input/output transistor region 104. Ion implantation processes for forming such well regions may be performed at later stages of the manufacturing process, as will be detailed below.

The semiconductor structure 800 further includes a pad layer 106 that is provided over the logic transistor region 102 and the input/output transistor region 104, as well as a first protection layer 107 that is also provided over the logic transistor region 102 and the input/output transistor region 104. Additionally, a mask 108, for example a photo mask, is provided over the logic transistor region 102 and the input/output transistor region 104.

For forming the above-described features of the semiconductor structure 800, techniques as described above with reference to FIG. 1 may be employed.

After the formation of the pad layer 106 and the first protection layer 107, the semiconductor structure 800 may include portions of the pad layer 106 and the first protection layer 107 over the ferroelectric transistor region 103. After the formation of the mask 108, these portions of the first protection layer 107 and the pad layer 106 may be removed from the ferroelectric transistor region 103. Additionally, a recess 801 may be formed in the ferroelectric transistor region 103. In the recess 801, a surface of the semiconductor material of the ferroelectric transistor region 103 exposed at the bottom of the recess 801 is provided at a depth relative to interfaces between the semiconductor materials of the logic transistor region 102 and the input/output transistor region 104 and the pad layer 106, the depth being measured in a thickness direction of the substrate 101. The depth of the recess 801 may be slightly smaller than a thickness of a ferroelectric transistor dielectric that will be deposited over the semiconductor structure 800 in later stages of the manufacturing process, as will be described below.

In some embodiments, the recess 801 may extend into portions of the shallow trench isolation structure 105 between the ferroelectric transistor region 103 and the logic transistor region 102 and into portions of the shallow trench isolation structure 105 between the ferroelectric transistor region 103 and the input/output transistor region 104, as shown in FIG. 8. The extension of the recess 801 may be defined by the mask 108, which, in turn, may be defined by means of a photolithography process used for forming the mask 108.

After the formation of the mask 108, a first etch process adapted to remove a material of the first protection layer 107 may be performed. In embodiments wherein the first protection layer 107 includes silicon nitride and the pad layer 106, as well as the shallow trench isolation structure 105, include silicon dioxide, the first etch process may be an etch process such as, for example, a dry etch process adapted to selectively remove silicon nitride relative to silicon dioxide. Accordingly, the first etch process may stop on the pad layer 106 and the shallow trench isolation structure 105.

Thereafter, a second etch process adapted to remove the materials of the pad layer 106, the shallow trench isolation structure 105 and the semiconductor material of the substrate 101 provided in the ferroelectric transistor region 103 may be performed. In particular, the second etch process may be an etch process, for example, a dry etch process, adapted to remove silicon dioxide and silicon. The depth of the recess 801 may be controlled by parameters of the second etch process, in particular by a duration of the second etch process.

Figure 9:
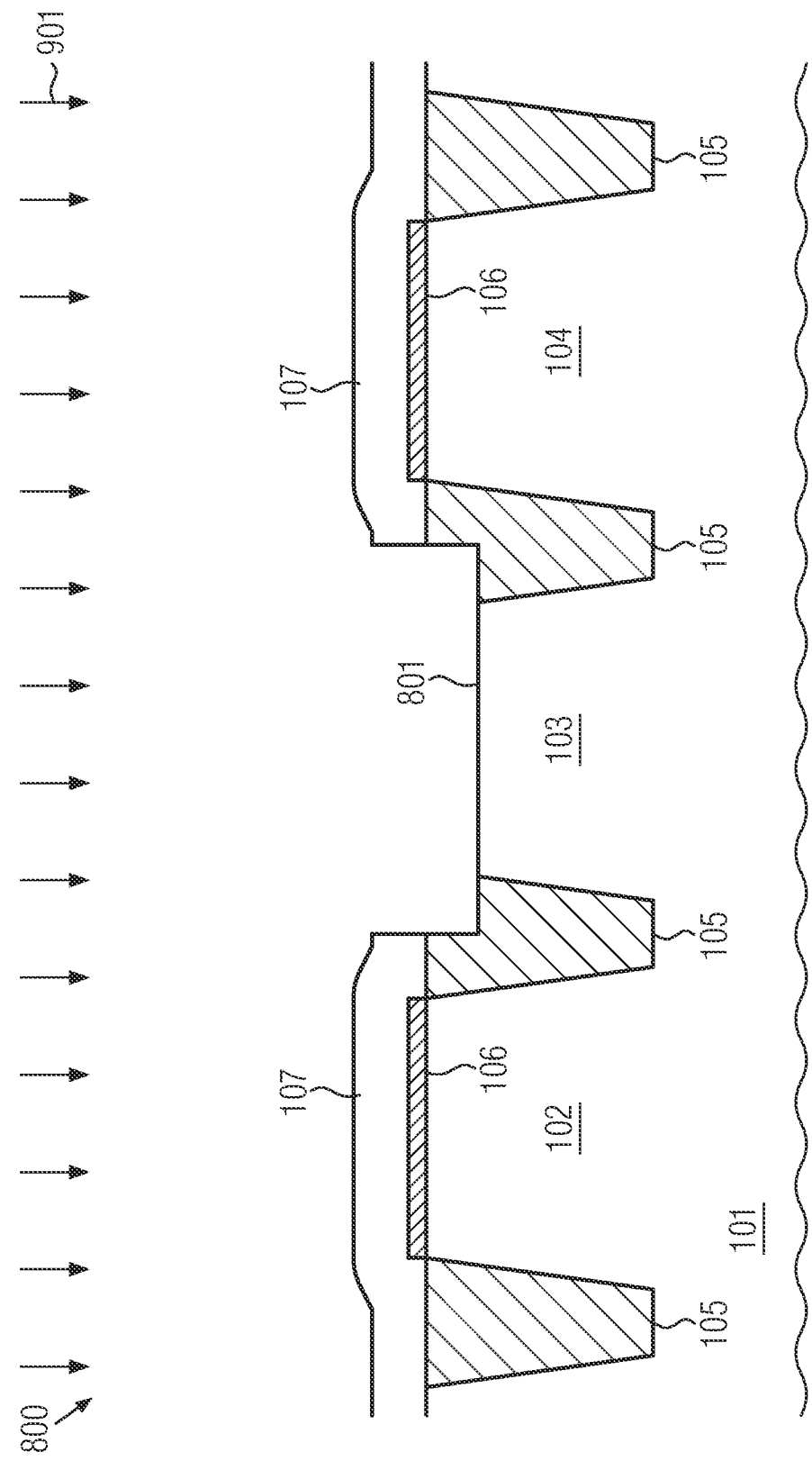

FIG. 9 shows a schematic cross-sectional view of the semiconductor structure 800 in a later stage of the manufacturing process. After the formation of the recess 801, the mask 108 may be removed by means of a resist strip process. Thereafter, an oxidation process may be performed, as schematically denoted by arrows 901 in FIG. 9. The oxidation process may be a thermal oxidation process, wherein the semiconductor structure 800 is exposed to an oxidizing ambient, such as a gas including oxygen and/or water vapor, at an elevated temperature. The portions of the first protection layer 107 over the logic transistor region 102 and the input/output transistor region 104 may protect the semiconductor material of the substrate 101 in the logic transistor region 102 and the input/output transistor region 104 from being affected by the oxidation process 901. However, an oxidation of the semiconductor material of the substrate 101 exposed at the surface of the semiconductor structure 800 in the ferroelectric transistor region 103 may be obtained.

Figure 10:
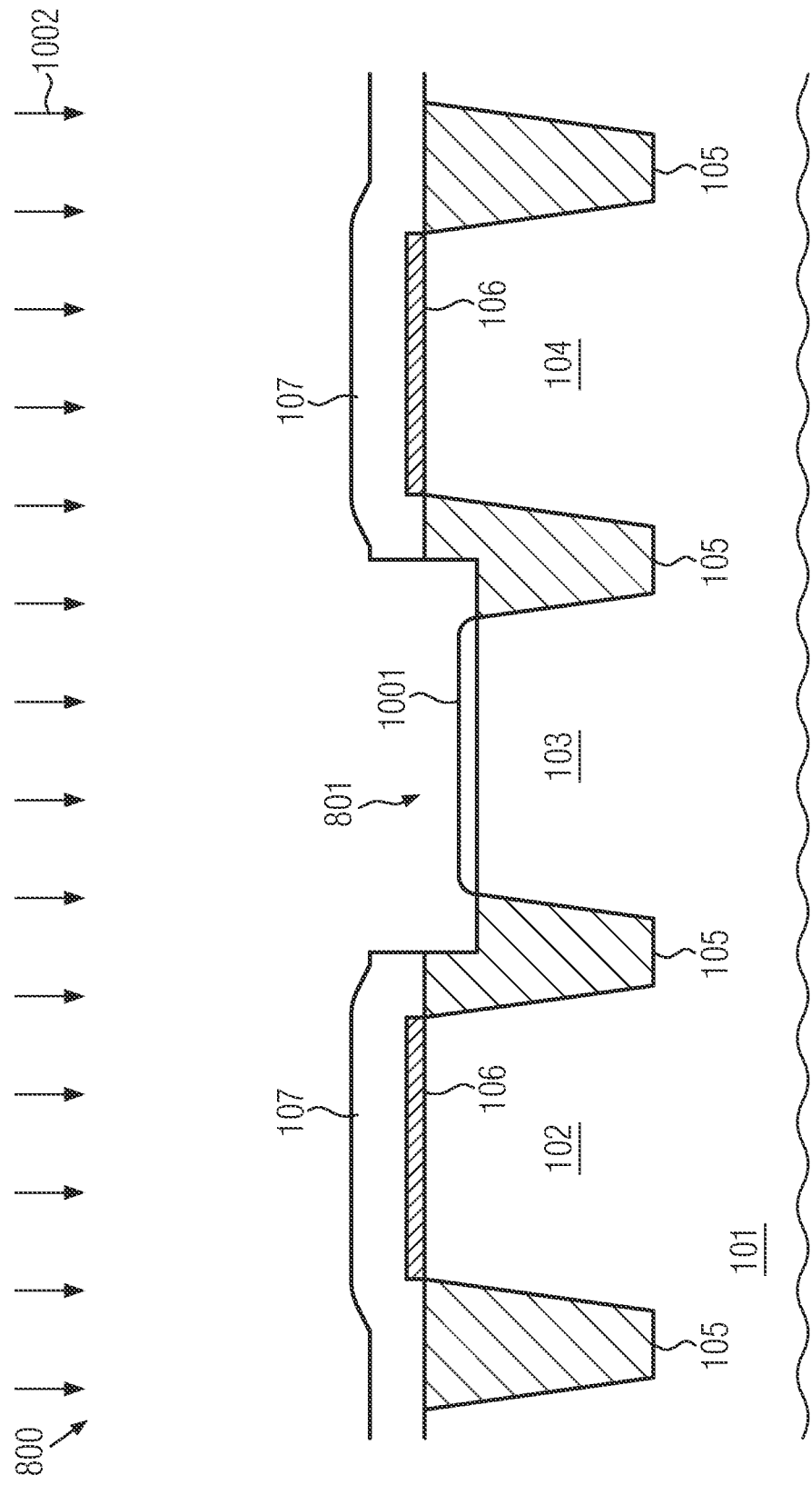

FIG. 10 shows a schematic cross-sectional view of the semiconductor structure 800 in a later stage of the manufacturing process. After the oxidation process 901, an oxide 1001 may be present at the bottom of the recess 801 in the ferroelectric transistor region 103.

Then, an etch process adapted to remove the oxide 1001 from the ferroelectric transistor region 103 may be performed, as schematically denoted by arrows 1002 in FIG. 10. In some embodiments, the etch process 1002 may be a wet etch process wherein the semiconductor structure 800 is exposed to an etchant adapted to remove silicon dioxide, for example, diluted hydrofluoric acid.

Due to the oxidation process 901 and the etch process 1002, a smoothing of the semiconductor material at the bottom of the recess 801 in the ferroelectric transistor region 103 may be obtained, and the depth of the recess 801 may be slightly increased.

After the etch process 1002, the depth of the recess 801 may be approximately equal to the thickness of a ferroelectric transistor dielectric that will be deposited over the semiconductor structure 800 in later stages of the manufacturing process, as detailed below. In some embodiments, the depth of the recess 801 may be in a range from about 10-30 nm.

Figure 11:
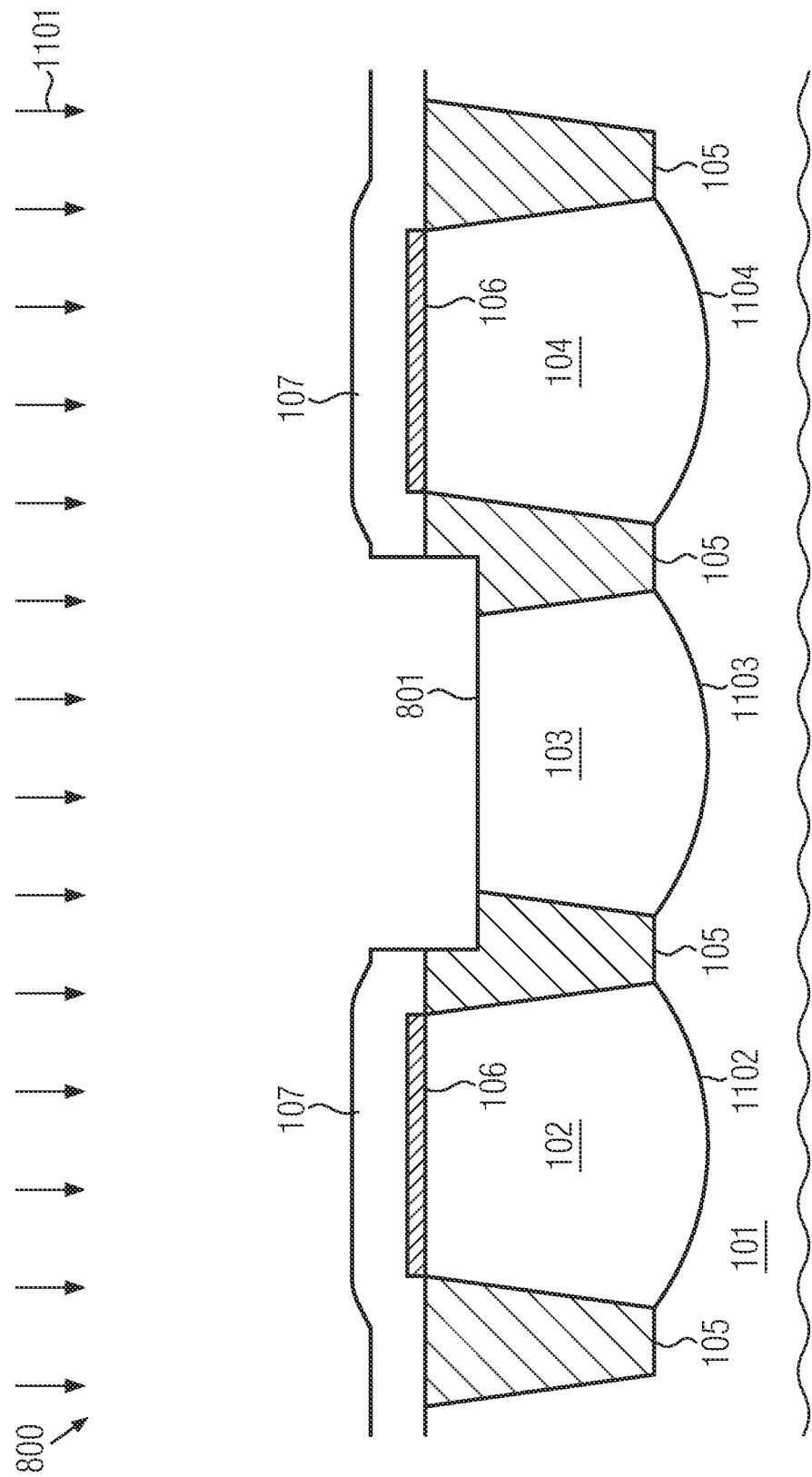

FIG. 11 shows a schematic cross-sectional view of the semiconductor structure 800 in a later stage of the manufacturing process. After the etch process 1002, an ion implantation process may be performed, as schematically denoted by reference numeral 1101 in FIG. 11. In the ion implantation process 1101, dopant ions may be implanted into the semiconductor structure 800. Due to the implantation of the dopant ions, a well region 1102 may be formed in the logic transistor region 102, a well region 1103 may be formed in the ferroelectric transistor region 103, and a well region 1104 may be formed in the input/output transistor region 104. In the well regions 1102, 1103, 1104, the semiconductor material in the logic transistor region 102, the ferroelectric transistor 103 and the input/output transistor region 104 obtains a doping that is different from the base doping of the substrate 101.

The present disclosure is not limited to embodiments wherein dopant ions are implanted into each of the logic transistor region 102, the ferroelectric transistor region 103 and the input/output transistor region 104 in a common ion implantation process. In other embodiments, a part of the semiconductor structure 800 may be covered by a first photoresist mask. Then, a first ion implantation process may be performed. Thereafter, the first photoresist mask may be removed and a second photoresist mask may be formed. Then, a second ion implantation process may be performed. This may allow providing well regions 1102, 1103, 1104 in the semiconductor structure 800 having different features. In particular, ions of an N-type dopant may be implanted into one or more of the transistor regions 102, 103, 104, and ions of a P-type dopant may be implanted into the rest of the transistor regions 102, 103, 104. Thus, a doping of the well regions 1102, 1103, 1104 may be adapted to the type of transistor (N-channel or P-channel) to be formed at the respective region.

Performing the one or more ion implantation processes that are employed for forming the well regions 1102, 1103, 1104 after the oxidation process 901 may help to avoid a diffusion of dopants from the well regions 1102, 1103, 1104 that might be caused by exposing the semiconductor structure 800 to relatively high temperatures in the oxidation process 901.

The present disclosure is not limited to embodiments wherein the one or more ion implantation processes 1101 are performed after the etch process 1002. In other embodiments, the one or more ion implantation processes 1101 may be performed after the oxidation process 901 and before the etch process 1002.

Figure 12:
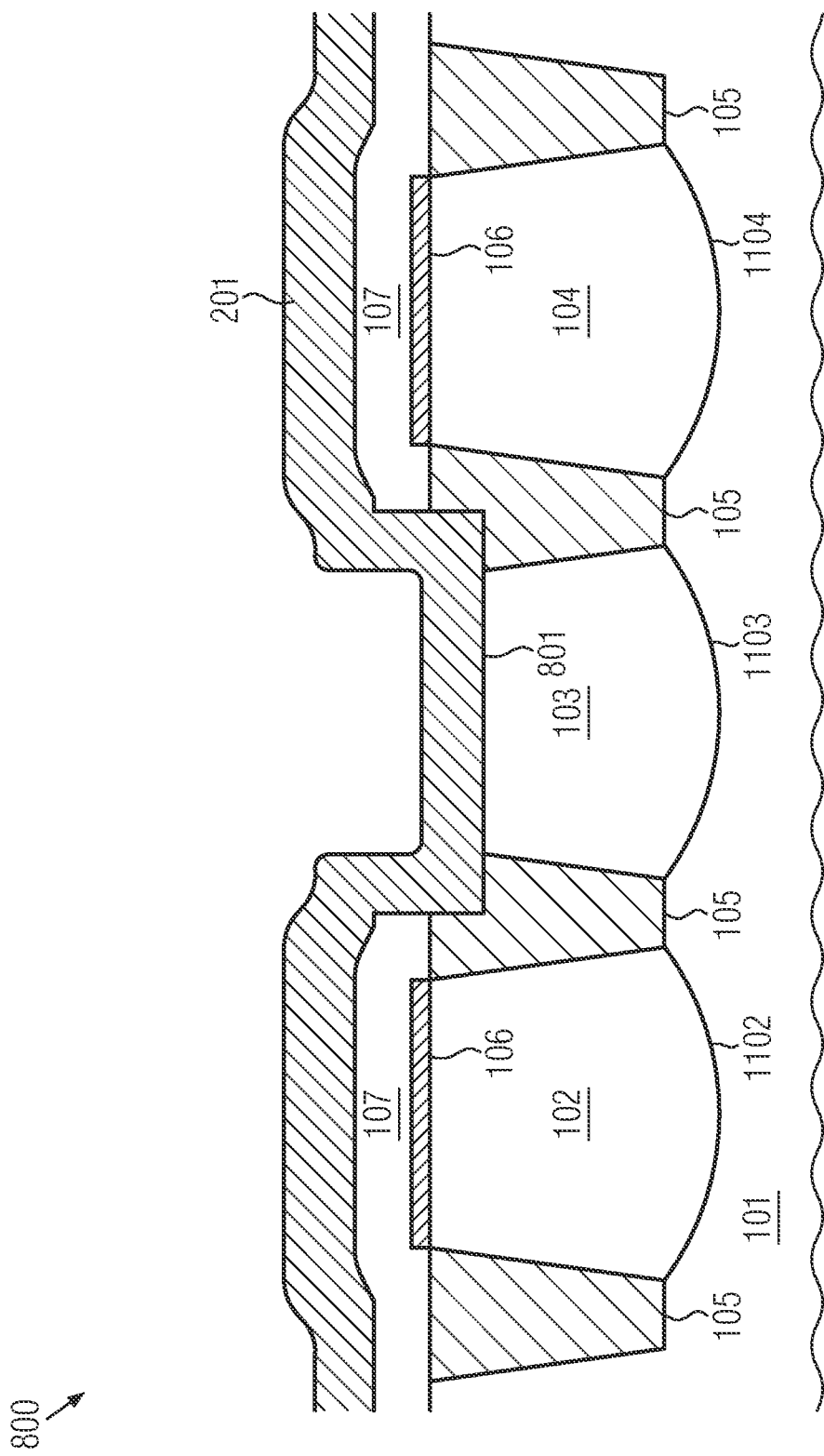

FIG. 12 shows a schematic cross-sectional view of the semiconductor structure 800 in a later stage of the manufacturing process. After the formation of the recess 801 and the well regions 1102, 1103, 1104, a ferroelectric transistor dielectric 201 may be deposited over the semiconductor structure. Similar to the embodiments described above with reference to FIGS. 1-7, the ferroelectric transistor dielectric 201 may include a material having ferroelectric properties, or a material that obtains ferroelectric properties after further processing steps such as, for example, an annealing performed in the presence of a metal layer on the ferroelectric transistor dielectric 201 that is performed in later stages of the manufacturing process.

Furthermore, similar to the embodiments as described above with references to FIGS. 1-7, the ferroelectric transistor dielectric 201 may include a base layer provided at the bottom of the ferroelectric transistor dielectric 201. The base layer may include silicon dioxide or silicon nitride, or any other dielectric that may help to improve an interface between the ferroelectric material of the ferroelectric transistor dielectric 201 and the semiconductor material of the ferroelectric transistor region 103. Furthermore, the base layer may be used as an etch stop layer in processes wherein the ferroelectric transistor dielectric 201 is etched in later stages of the manufacturing process.

A thickness of the layer 201 of ferroelectric transistor dielectric may be approximately equal to the depth of the recess 801, so that the recess 801 is substantially filled with the ferroelectric transistor dielectric 201, and a surface of a portion of the ferroelectric transistor dielectric 201 above the semiconductor material of the ferroelectric transistor region 103 is approximately in a same plane as interfaces between the pad layer 106 and the semiconductor material in the logic transistor region 102 and the input/output transistor region 104.

Thereafter, further processing steps may be performed, as described above with reference to FIGS. 2-7, for forming a logic transistor at the logic transistor region 102, a ferroelectric transistor at the ferroelectric transistor region 103, and an input/output transistor at the input/output transistor region 104.

In the following, further embodiments will be described with reference to FIGS. 13 and 14. For convenience, in FIGS. 1-12, on the one hand, and in FIGS. 13-14, on the other hand, like reference numerals are used to denote like components. Unless explicitly stated otherwise, components denoted by like reference numerals may have corresponding or similar features, and like or similar methods may be used for the formation thereof. Accordingly, a detailed description thereof will sometimes be omitted.

Figure 13:
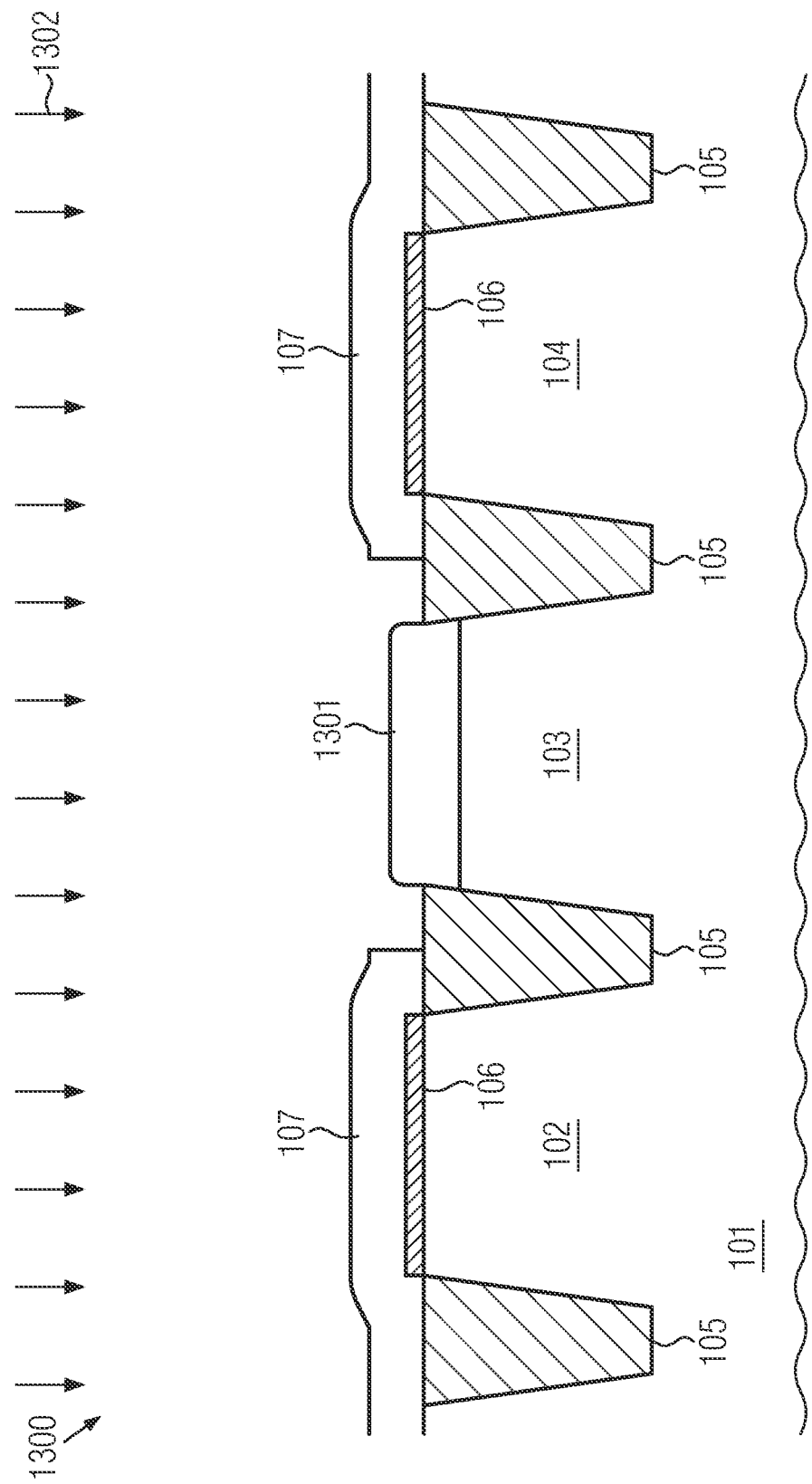
FIGS. 13-14 show schematic cross-sectional views of a semiconductor structure according to an embodiment in stages of a manufacturing process according to an embodiment.

FIG. 13 shows a schematic cross-sectional view of a semiconductor structure 1300 according to an embodiment in a stage of a manufacturing process according to an embodiment. Similar to the semiconductor structure 800 described above with reference to FIGS. 8-12, the semiconductor structure 1300 includes a substrate 101. In the substrate 101, a logic transistor region 102, a ferroelectric transistor region 103 and an input/output transistor region 104 are provided. A shallow trench isolation structure 105 provides electrical insulation between the logic transistor region 102, the ferroelectric transistor region 103 and the input/output transistor region 104, as well as electrical insulation between the logic transistor region 102, the ferroelectric transistor region 103, the input/out transistor region 104 and other circuit elements in the semiconductor structure 1300 (not shown).

Similar to the embodiments described above with reference to FIGS. 8-12, in the stage of the manufacturing process shown in FIG. 13, a doping of each of the logic transistor region 102, the ferroelectric transistor region 103 and the input/output transistor region 104 may substantially correspond to a base doping of the substrate 101. Ion implantation processes for forming well regions in the logic transistor region 102, the ferroelectric transistor region 103 and the input/output transistor region 104 may be performed in later stages of the manufacturing process, as will be detailed below.

The semiconductor structure 1300 further includes a pad layer 106 and a first protection layer 107. At the stage of the manufacturing process shown in FIG. 13, the pad layer 106 and the first protection layer 107 are provided over the logic transistor region 102 and the input/output transistor region 104, but not over the ferroelectric transistor region 103.

The pad layer 106 and the first protection layer 107 may be formed as described above with reference to FIG. 1, wherein, initially, the pad layer 106 and the first protection layer 107 are provided over each of the logic transistor region 102, the ferroelectric transistor region 103 and the input/output transistor region 104. Thereafter, a mask similar to the mask 108 described above with reference to FIGS. 1 and 8 may be formed over the semiconductor structure 1300, and the portions of the pad layer 106 and the first protection layer 107 over the ferroelectric transistor region 103 may be removed by means of one or more etch processes.

Similar to the embodiments described above with reference to FIGS. 1-7, and different from the embodiments described above with reference to FIGS. 8-12, substantially no semiconductor material of the ferroelectric transistor region 103 needs to be removed by means of an etch process after the removal of the pad layer 106 and the first protection layer 107 from the ferroelectric transistor region 103. Instead, after the removal of the portions of the pad layer 106 and the first protection layer 107 from the ferroelectric transistor region 103, the mask used for the removal of the portions of the pad layer 106 and the first protection layer 107 over the ferroelectric transistor region 103 may be removed by means of a resist strip process, and an oxidation process may be performed. The oxidation process may be a thermal oxidation process, wherein the semiconductor structure 1300 is exposed to an oxidizing ambient, for example, a gas including oxygen and/or water vapor, at an elevated temperature. In the oxidation process, the semiconductor material of the substrate 101 exposed at the surface of the semiconductor structure 1300 at the ferroelectric transistor region 103 may be oxidized, so that an oxide 1301 is formed. The logic transistor region 102 and the input/output transistor region 104 may be protected from the oxidizing ambient by the first protection layer 107. Thus, substantially no oxidation of semiconductor material is obtained in the logic transistor region 102 and the input/output transistor region 104. In some embodiments, features of the oxidation process may correspond to features of known LOCOS (Local Oxidation of Silicon) processes.

Since a part of the semiconductor material of the substrate 101 in the ferroelectric transistor region 103 is consumed in the oxidation process, an interface between the semiconductor material and the oxide 1301 is at a greater depth than the surface of the ferroelectric transistor region 103 that is obtained after the removal of the pad layer 106 and the first protection layer 107 from the ferroelectric transistor region 103.

After the oxidation process, an etch process may be performed, as schematically denoted by arrows 1302 in FIG. 13. The etch process 1302 may be an etch process adapted to remove the oxide 1301 from the semiconductor structure 1300. For example, the etch process 1302 may be a wet etch process wherein diluted hydrofluoric acid is employed. In other embodiments, the etch process 1302 may be a dry etch process. The first protection layer 107, which may be formed from a different material than silicon dioxide, such as, for example, silicon nitride, may remain substantially unaffected by the etch process 1302, so that the portions of the first protection layer 107 over the logic transistor region 102 and the input/output transistor region 104 are not removed from the semiconductor structure 1300 by the etch process 1302.

Figure 14:
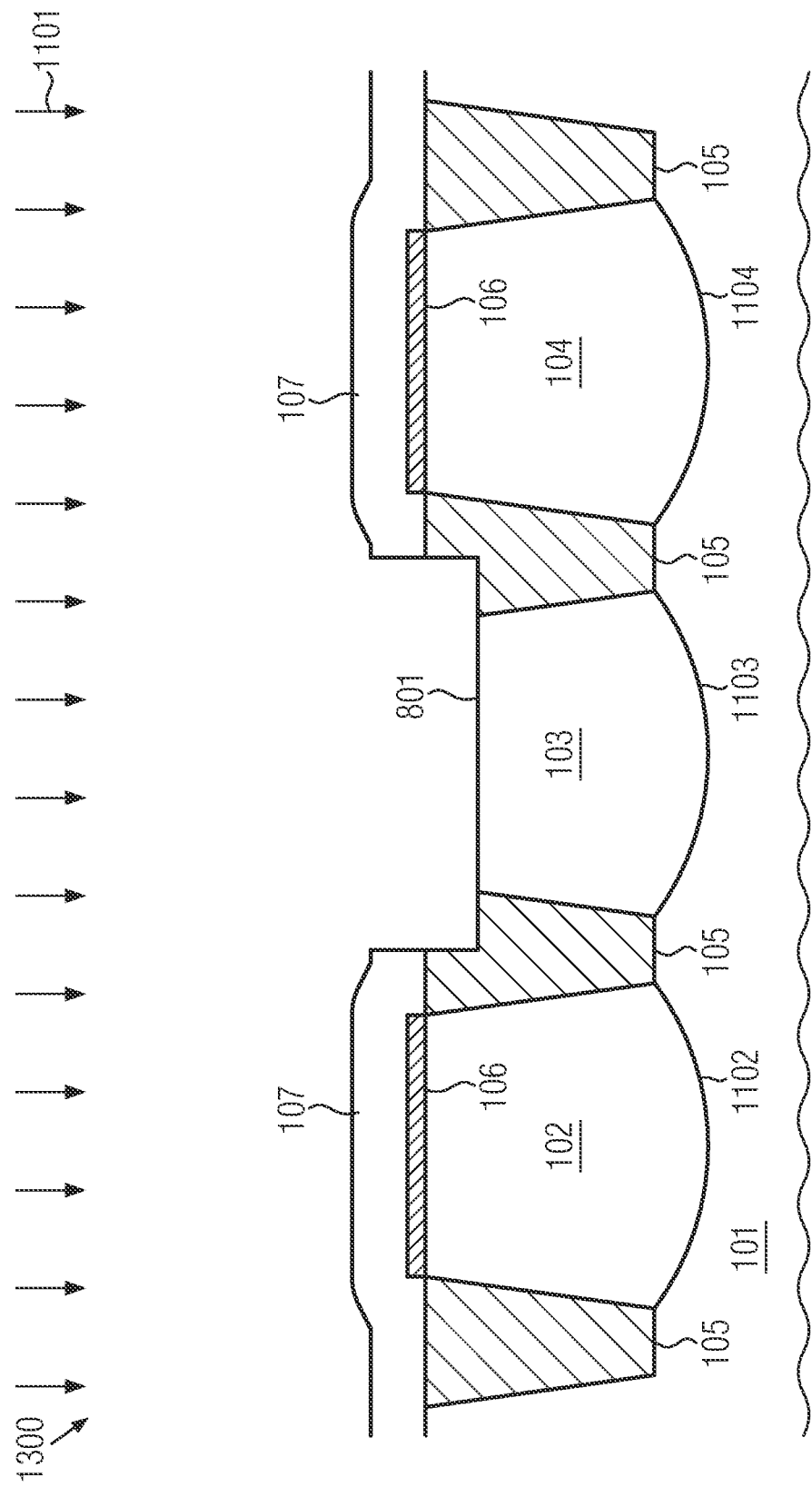

FIG. 14 shows a schematic cross-sectional view of the semiconductor structure 1300 in a later stage of the manufacturing process. After the removal of the oxide 1301 from the semiconductor structure 1300 by means of the etch process 1302, a recess 801 may be obtained at the ferroelectric transistor region 103. A depth of the recess 801 may correspond to an amount of semiconductor material from the logic transistor region 103 that was oxidized in the formation of the oxide 1301. Hence, the depth of the recess 801 may be controlled by varying parameters of the oxidation process, in particular a duration of the oxidation process.

In embodiments wherein the shallow trench isolation structure 105 includes silicon dioxide, a part of the silicon dioxide in the shallow trench isolation structure 105 adjacent the ferroelectric transistor region 103 that is not covered by the first protection layer 107 may also be removed. Thus, as shown in FIG. 14, the shallow trench isolation structure 105 may also be recessed adjacent the ferroelectric transistor region 103. Thus, a shape of the recess 801 similar to that obtained in the embodiments described above with reference to FIGS. 8-12 may be obtained.

After the etch process 1302, one or more ion implantation processes may be performed, as schematically denoted by arrows 1101 in FIG. 14. In the one or more ion implantation processes 1101, ions of one or more dopants may be introduced into the semiconductor structure 1300, so that a well region 1102 is formed in the logic transistor region 102, a well region 1103 is formed in the ferroelectric transistor region 103 and a well region 1104 is formed in the input/output transistor region 104.

The present disclosure is not limited to embodiments wherein the one or more ion implantation processes 1101 are performed after the removal of the oxide 1301. In other embodiments, the one or more ion implantation processes 1101 that are performed for forming the well regions 1102, 1103, 1104 may be performed after the formation of the oxide 1301 and before the etch process 1302 that is performed for removing the oxide 1301. Thus, dopant ions that are implanted into the ferroelectric transistor region 103 for forming the well region 1103 are implanted through the oxide 1301. The presence of the oxide 1301 in the one or more ion implantation processes 1101 may have an influence on a doping profile of the well region 1103. For example, the oxide 1301 may absorb and/or decelerate ions, so that a smaller dopant concentration and/or a shallower well region 1103 may be obtained in the ferroelectric transistor region 103 than in the logic transistor region 102 and the input/output transistor region 104.

After the etch process 1302 and the one or more ion implantation processes 1101, a ferroelectric transistor dielectric 201 may be formed over the semiconductor 1300, as described above with reference to FIG. 8. The thickness of the ferroelectric transistor dielectric may be approximately equal to the depth of the recess 801 formed by the oxidation of the semiconductor material in the ferroelectric transistor region 103 and the etch process 1302.

Thereafter, further processing steps as described above with reference to FIGS. 2-7 may be performed for forming a logic transistor at the logic transistor region 102, a ferroelectric transistor at the ferroelectric transistor region 103 and an input/output transistor at the input/output transistor region 104.

In the following, further embodiments will be described with reference to FIGS. 15-17. For convenience, in FIGS. 1-14, on the one hand, and in FIGS. 15-17, on the other hand, like reference numerals are used to denote like components. Unless explicitly stated otherwise, features denoted by like reference numerals may have corresponding or similar features, and like or similar methods may be used for the formation thereof. Accordingly, a detailed description thereof will sometimes be omitted.

Figure 15:
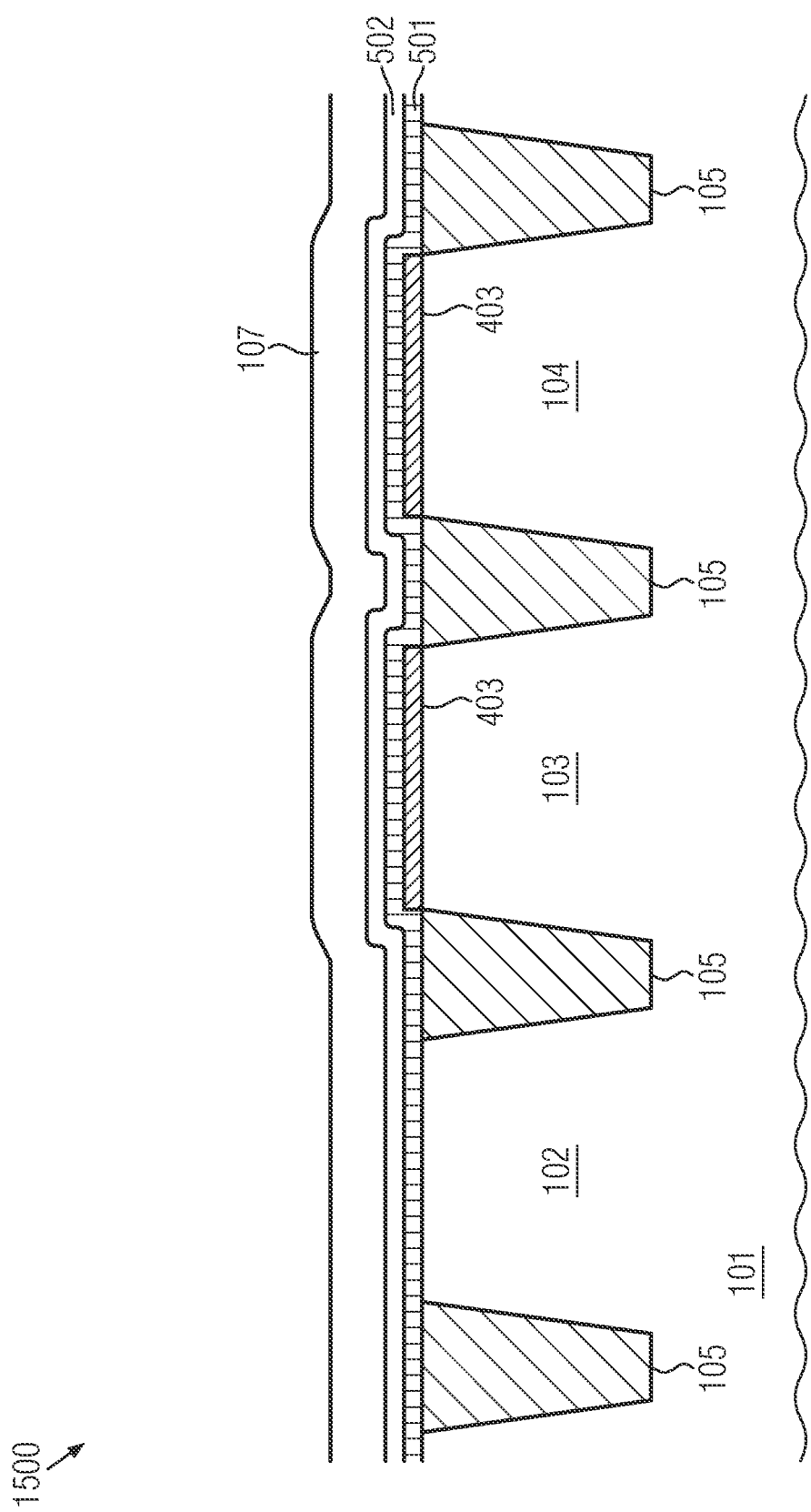
FIGS. 15-17 show schematic cross-sectional views of a semiconductor structure according to an embodiment in stages of a manufacturing process according to an embodiment.

FIG. 15 shows a schematic cross-sectional view of a semiconductor structure 1500 according to an embodiment in a stage of a manufacturing process according to an embodiment. The semiconductor structure 1500 includes a substrate 101. The substrate 101 includes a logic transistor region 102, a ferroelectric transistor region 103 and an input/output transistor region 104. A shallow trench isolation structure 105 provides electrical insulation between the logic transistor region 102, the ferroelectric transistor region 103 and the input/output transistor region 104, as well as between the logic transistor region 102, the ferroelectric transistor region 103 and the input/output transistor region 104 and other circuit elements in the semiconductor structure 1500.

At the stage of the manufacturing process shown in FIG. 15, a doping of each of the logic transistor region 102, the ferroelectric transistor region 103 and the input/output transistor region 104 may be approximately equal to a base doping of a substrate 101.

The semiconductor structure 1500 further includes an input/output transistor dielectric 403. The input/output transistor dielectric 403 is provided over the ferroelectric transistor region 103 and the input/output transistor region 104, but not over the logic transistor region 102. Similar to the embodiments described above with reference to FIGS. 1-7, the input/output transistor dielectric 403 may include an electrically insulating material such as, for example, silicon dioxide, and it may be formed by means of techniques such as, for example, thermal oxidation and/or deposition techniques, such as CVD and/or PECVD. Further features of the input/output transistor dielectric 403 may correspond to those described above with reference to FIG. 4.

After the formation of the input/output transistor dielectric 403, a portion of the input/output transistor dielectric 403 may also be present over the logic transistor region 102. The portion of the input/output transistor dielectric 403 over the logic transistor region 102 may then be removed. For this purpose, a mask, for example a photoresist mask (not shown), may be formed over the semiconductor structure 1500, wherein the mask covers the ferroelectric transistor region 103 and the input/output transistor region 104, but not the logic transistor region 102. Thereafter, an etch process, for example, an etch process wherein diluted hydrofluoric acid is used as an etchant, may be performed for removing the portion of the input/output transistor dielectric 403 over the logic transistor region 102.

The semiconductor structure 1500 further includes a logic transistor dielectric 501 and a first metal 502. The logic transistor dielectric 501 and the first metal 502 may be provided over each of the logic transistor region 102, the ferroelectric transistor region 103 and the input/output transistor region 104. Features of the logic transistor dielectric 501 and the first metal 502, and techniques used for the formation thereof, may correspond to those described above with reference to FIG. 5.

The semiconductor structure 1500 further includes a protection layer 107 provided over the first metal 502.

Figure 16:
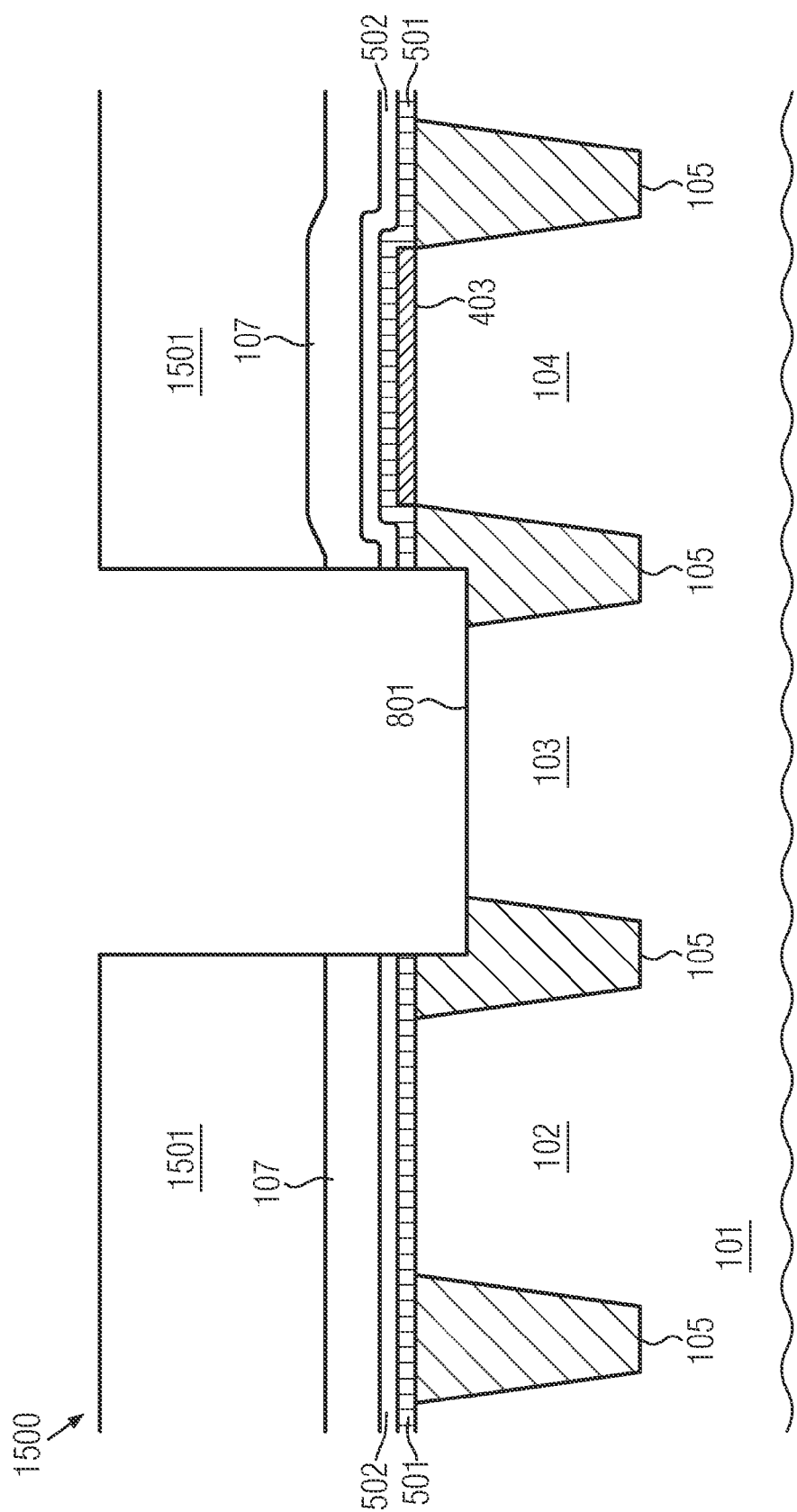

FIG. 16 shows a schematic cross-sectional view of the semiconductor structure 1500 in a later stage of the manufacturing process. After the formation of the protection layer 107, a mask 1501 may be formed over the semiconductor structure 1500. The mask 1501 may be a photoresist mask and may be formed by means of photolithography. The mask 1501 may be provided over the logic transistor region 102 and the input/output transistor region 104, but not over the ferroelectric transistor region 103.

Thereafter, one or more etch processes may be performed for removing portions of the protection layer 107, the first metal 502, the logic transistor dielectric 501 and the input/output transistor dielectric 403 over the ferroelectric transistor region 103. Additionally, portions of the semiconductor material of the substrate 101 in the ferroelectric transistor region 103 and, optionally, portions of the shallow trench isolation structure 105 may be etched for forming a recess 801 in the ferroelectric transistor region 103. The etch processes employed may include dry etch processes, wet etch processes and combinations of dry and wet etch processes adapted for removing the materials of the protection layer 107, the metal 502, the logic transistor dielectric 501, the input/output transistor dielectric 403, the semiconductor material of the substrate 101 and/or the material of the shallow trench isolation structure 105.

The mask 1501 need not be present during all of the etch processes. In some embodiments, the mask 1501 may be employed for removing the portion of the protection layer 107 over the ferroelectric transistor region 103. Thereafter, further etch processes may be performed for removing the portions of the metal 502, the logic transistor dielectric 501 and the input/output transistor dielectric 403 over the ferroelectric transistor region 103 and for forming the recess 801. In other embodiments, the mask 1501 may be removed after the removal of the portion of the input/output transistor dielectric 403 over the ferroelectric transistor region 103 and before the formation of the recess 801.

In some embodiments, after etching the semiconductor material of the ferroelectric transistor region 103 for forming the recess, an oxidation process and an etch process similar to the processes 901, 1002 described above with reference to FIGS. 9 and 10 may be performed for smoothing the bottom of the recess 801.

In further embodiments, substantially the entire removal of semiconductor material from the ferroelectric transistor region 103 that is performed for forming the recess 801 may be performed by means of processes of oxidation and etching, as described above with reference to FIGS. 13 and 14.

Figure 17:
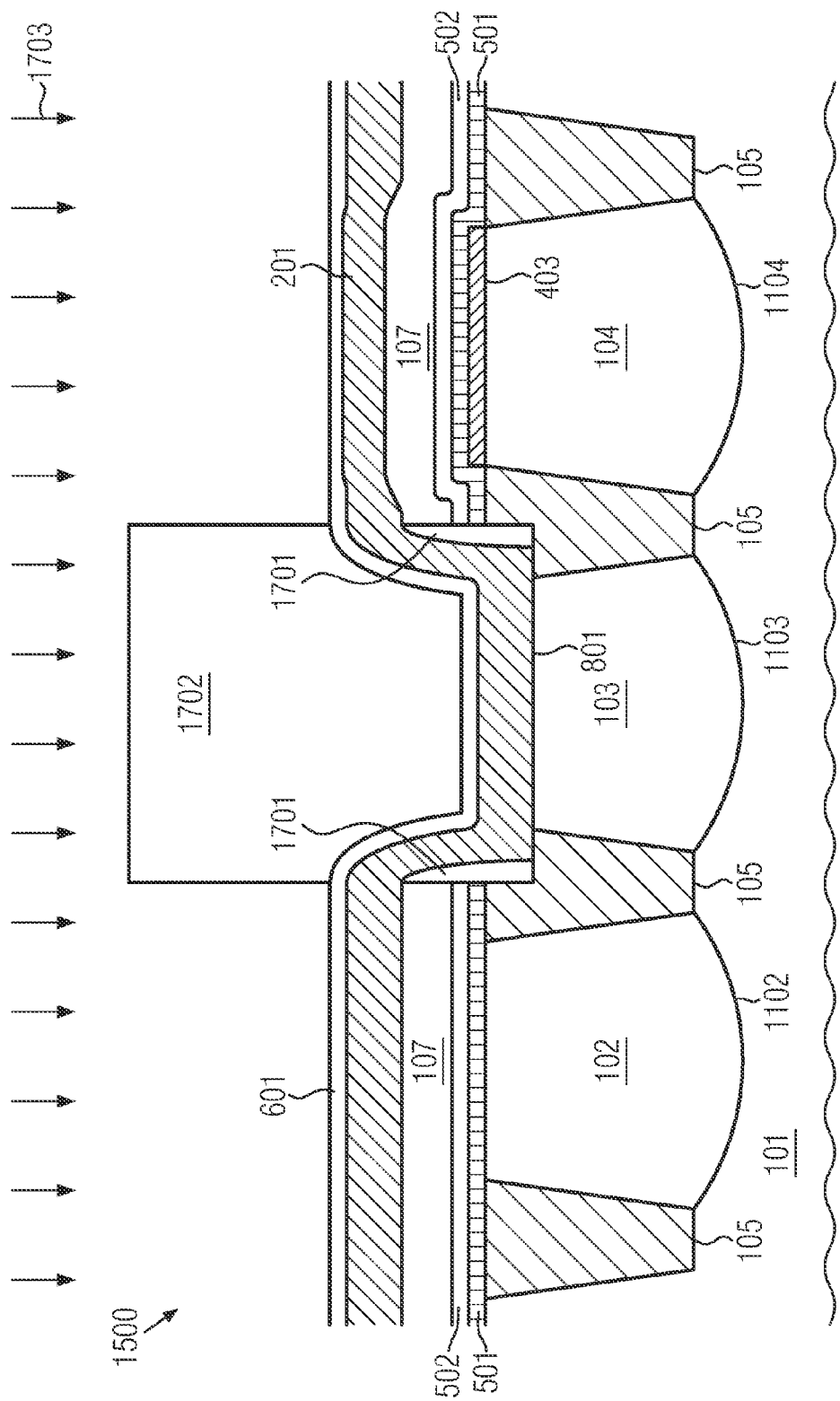

FIG. 17 shows a schematic cross-sectional view of the semiconductor structure 1500 in a later stage of the manufacturing process. After the formation of the recess 801, a spacer 1701 may be formed at sidewalls of the recess 801 and at sidewalls of the logic transistor dielectric 501, the first metal 502 and the protection layer 107 over the logic transistor region 102 and the input/output transistor region 104. For forming the spacer 1701, a layer of a material of the spacer 1701, for example, a layer of silicon nitride, may be substantially isotropically deposited over the semiconductor structure 1500. Then, an anisotropic etch process may be performed for removing portions of the layer of the material of the spacer 1701 from substantially horizontal portions of the semiconductor structure 1500, such as, for example, the surface of the substrate 101 exposed at the bottom of the recess 801 in the ferroelectric transistor region 103 and top surfaces of the protection layer 107. Due to the anisotropy of the etch process, portions of the layer of the material of the spacer 1701 at the sidewalls of the recess 801, and the various layers on the logic transistor region 102 and the input/output transistor region 104 may remain in the semiconductor structure 1500 and form the spacer 1701. The spacer 1701 may provide protection for portions of the layers of the input/output transistor dielectric 403, the logic transistor dielectric 501 and the first metal 502 over the logic transistor region 102 and the input/output transistor region 104, in addition to the protection provided by the protection layer 107.

The present disclosure is not limited to embodiments wherein the spacer 1701 is formed. In other embodiments, the formation of the spacer 1701 may be omitted.

After the formation of the recess 801 and, optionally, the spacer 1701, a well region 1102 may be formed in the logic transistor region 102, a well region 1103 may be formed in the ferroelectric transistor region 103 and a well region 1104 may be formed in the input/output transistor region 104. Similar to the embodiments described above, this may be done by means of one or more ion implantation processes wherein dopants are introduced into the semiconductor structure 1500, wherein masks (not shown) may optionally be used for introducing different dopants into the logic transistor region 102, the ferroelectric transistor region 103 and the input/output transistor region 104.

Thereafter, a ferroelectric transistor dielectric 201, which may optionally include a base layer provided at the bottom of the ferroelectric transistor dielectric 201, may be formed over the semiconductor structure 1500. A thickness of the ferroelectric transistor dielectric 201 may be approximately equal to a depth of the recess 801, so that the recess 801 is filled with the ferroelectric transistor dielectric 201, and a surface of the ferroelectric transistor dielectric 201 is substantially in a same plane as an interface between the semiconductor material in the logic transistor region 102 and the logic transistor dielectric 501 and an interface between the semiconductor material in the input/output transistor region 104 and the input/output transistor dielectric 403.

Thereafter, a second metal 601 may be deposited over the semiconductor structure 1500, and an annealing process may be performed for re-crystallizing the ferroelectric transistor dielectric 201 in the presence of the second metal 601. In doing so, a crystalline structure of the ferroelectric transistor dielectric 201 having ferroelectric properties may be obtained.

Thereafter, a mask 1702 that covers the ferroelectric transistor region 103, but not the logic transistor region 102 and the input/output transistor region 104, may be formed. The mask 1702 may be a photoresist mask, and it may be formed by means of a photolithography process. Then, one or more processes for removing materials of the second metal 601, the ferroelectric transistor dielectric 201 and the protection layer 107 may be performed. The logic transistor dielectric 501 and the first metal 502 may remain over each of the logic transistor region 102 and the input/output transistor region 104, and the input/output transistor dielectric 403 may remain over the input/output transistor region 104.

Then, the mask 1702 may be removed by means of a resist strip process, and gate electrodes may be formed over each of the logic transistor region 102, the ferroelectric transistor region 103 and the input/output transistor region 104 using techniques as described above with reference to FIGS. 6 and 7.

In the following, further embodiments will be described with reference to FIG. 18. For convenience, in FIGS. 1-17, on the one hand, and in FIG. 18, on the other hand, like reference numerals are used to denote like components. Unless explicitly stated otherwise, components denoted by like reference numerals may have corresponding or similar features, and like or similar methods may be used for the formation thereof. Accordingly, a detailed description thereof will sometimes be omitted.

Figure 18:
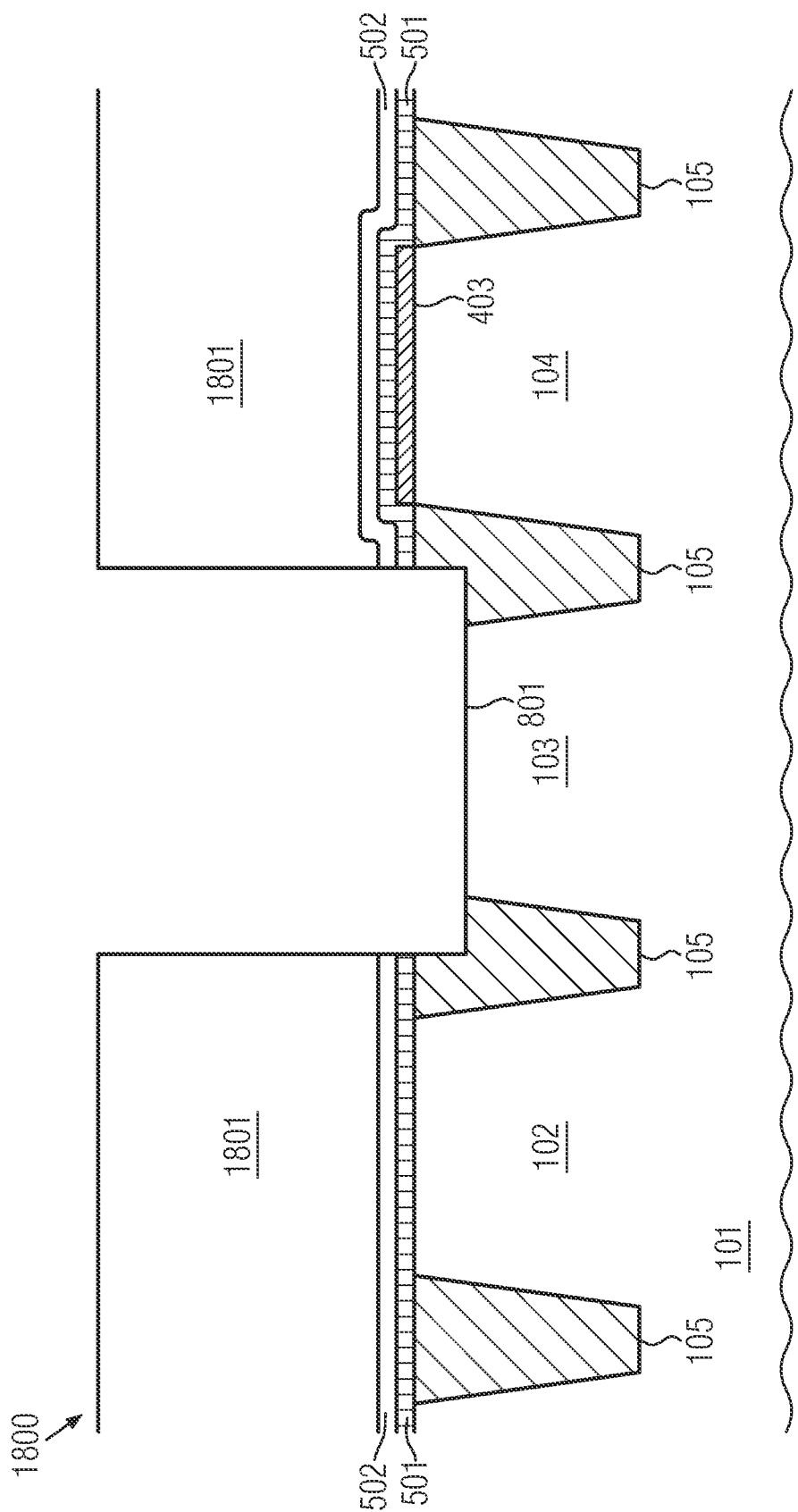
FIG. 18 shows a schematic cross-sectional view of a semiconductor structure according to an embodiment in a stage of a manufacturing process according to an embodiment.

FIG. 18 shows a schematic cross-sectional view of a semiconductor structure 1800 according to an embodiment. The semiconductor structure 1800 includes a substrate 101. The substrate 101 includes a logic transistor region 102, a ferroelectric transistor region 103 and an input/output transistor region 104. A shallow trench isolation structure 105 provides electrical isolation between the logic transistor region 102, the ferroelectric transistor region 103 and the input/output transistor region 104, as well as between the logic transistor region 102, the ferroelectric transistor region 103 and the input/output transistor region 104 and other circuit elements (not shown) in the semiconductor structure 1800.

The semiconductor structure 1800 further includes an input/output transistor dielectric 403, a logic transistor dielectric 501 and a first metal 502. The input/output transistor dielectric 403 is provided over the input/output transistor region 104. The logic transistor dielectric 501 and the first metal 502 are provided over each of the logic transistor region 102 and the input/output transistor region 104.

At an earlier stage of the manufacturing process than the stage shown in FIG. 18, the input/output transistor dielectric 403, the logic transistor dielectric 501 and the first metal 502 may also be provided over the ferroelectric transistor region 103, similar to the semiconductor structure 1500 in the stage of the manufacturing process shown in FIG. 15.

The semiconductor structure 1800 further includes a masking layer 1801 that is provided over the logic transistor region 102 and the input/output transistor region 104, but not over the ferroelectric transistor region 103. In some embodiments, the masking layer 1801 may be a photoresist mask, and it may be formed by means of a photolithography process. In other embodiments, the masking layer 1801 may be a hardmask formed of a hardmask material such as, for example, silicon nitride. In such embodiments, the masking layer 1801 may be formed by depositing a layer of a material of the masking layer 1801 over the semiconductor structure 1800 and patterning the masking layer 1801 by means of processes of photolithography and etching.

After the formation of the masking layer 1801, one or more etch processes may be performed for removing portions of the first metal 502, the logic transistor dielectric 501 and the input/output transistor dielectric 403 over the ferroelectric transistor region 103 and for forming a recess 801 in the ferroelectric transistor region 103.

Thereafter, the masking layer 1801 may be removed. In embodiments wherein the masking layer 1801 is a photoresist mask, this may be done by means of a resist strip process. In embodiments wherein the masking layer 1801 is a hardmask, this may be done by means of an etch process adapted to selectively remove the material of the masking layer 1801 relative to the materials of the first metal 502, the shallow trench isolation structure 105 and the semiconductor material of the ferroelectric transistor region 103.

In some embodiments, after the formation of the recess 801, an oxidation process and an etch process may be performed for smoothing a surface of the semiconductor material in the ferroelectric transistor region 103 exposed at the bottom of the recess 801, similar to the embodiments described above with reference to FIGS. 8-12.

Thereafter, further processing steps may be performed, as described above with reference to FIG. 17. In particular, well regions may be formed in the transistor regions 102, 103, 104, a ferroelectric transistor dielectric and a second metal may be deposited, an annealing process may be performed, and portions of the ferroelectric transistor dielectric and the second metal over the logic transistor region 102 and the input/output transistor region 104 may be removed by means of an etch process. Since, in the embodiment of FIG. 18, no protection layer 107 is employed, in the removal of the ferroelectric transistor dielectric from the logic transistor region 102 and the input/output transistor region 104, the first metal 502 may be employed as an etch stop layer.

Thereafter, gate electrodes may be formed over the logic transistor region 102, the ferroelectric transistor region 103 and the input/output transistor region 104 using techniques as described above with reference to FIGS. 6 and 7.

In the following, further embodiments will be described with reference to FIGS. 19-21. For convenience, in FIGS. 1-18, on the one hand, and in FIGS. 19-21, on the other hand, like reference numerals are used to denote like components. Unless explicitly stated otherwise, features denoted by like reference numerals may have corresponding or similar features, and like or similar methods may be used for the formation thereof. Accordingly, a detailed description thereof will sometimes be omitted.

Figure 19:
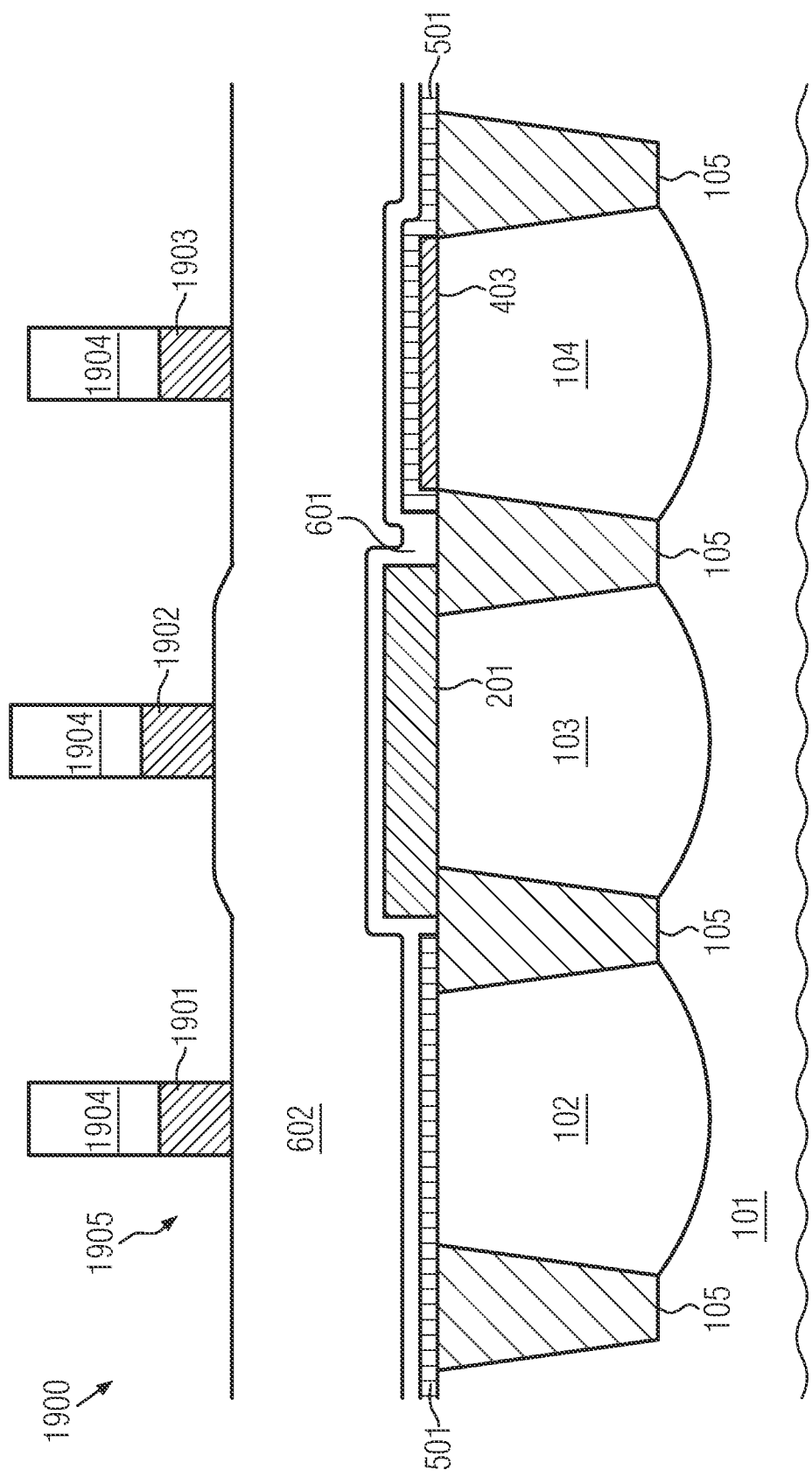
FIGS. 19-21 show schematic cross-sectional views of a semiconductor structure in stages of a manufacturing process according to an embodiment.

FIG. 19 shows a schematic cross-sectional view of a semiconductor structure 1900 in a stage of a manufacturing process according to an embodiment. The semiconductor structure 1900 includes a substrate 101. In the substrate 101, a logic transistor region 102, a ferroelectric transistor region 103 and an input/output transistor region 104 are provided. The logic transistor region 102, the ferroelectric transistor region 103 and the input/output transistor region 104 may include respective well regions having a dopant concentration that is different from a base doping of the substrate 101. A shallow trench isolation structure 105 may provide electrical insulation between the logic transistor region 102, the ferroelectric transistor region 103 and the input/output transistor region 104, as well as between the logic transistor region 102, the ferroelectric transistor region 103 and the input/output transistor region 104 and other circuit elements (not shown) in the semiconductor structure 1900.

The semiconductor structure 1900 further includes an input/output transistor dielectric 403 provided over the input/output transistor region 104, a ferroelectric transistor dielectric 201 provided over the ferroelectric transistor region 103, a logic transistor dielectric 501 provided over the logic transistor region 102 and the input/output transistor region 104, and a metal 601 provided over each of the logic transistor region 102, the ferroelectric transistor region 103 and the input/output transistor region 104. Over the metal 601, a gate electrode material 602, for example polycrystalline silicon or amorphous silicon, may be provided.

The above-described features of the semiconductor structure 1900 may be formed as described above with reference to FIGS. 1-6.

The present disclosure is not limited to embodiments wherein an interface between the semiconductor material of the ferroelectric transistor region 103 and the ferroelectric transistor dielectric 201 is substantially in a same plane as an interface between the semiconductor material of the logic transistor region 102 and the logic transistor dielectric 501 and an interface between the semiconductor material of the input/output transistor region 104 and the input/output transistor dielectric 403, as shown in FIG. 19. In other embodiments, the ferroelectric transistor dielectric 201 may be provided in a recess in the ferroelectric transistor region 103. In such embodiments, techniques as described above with reference to FIGS. 8-18 may be employed for forming the semiconductor structure 1900.

The semiconductor structure 1900 further includes a hardmask 1905. The hardmask 1905 includes a portion 1901 above the logic transistor region 102, which is provided at a location wherein a gate electrode of a logic transistor region is to be formed. Furthermore, the hardmask 1905 includes portions 1902, 1903 which are provided over the ferroelectric transistor region 103 and the input/output transistor region 104, respectively, and which are provided at locations of gate electrodes of a ferroelectric transistor and an input/output transistor to be formed over the ferroelectric transistor region 103 and the input/output transistor region 104, respectively. Further portions of the hardmask 1905 may be provided over portions of the semiconductor structure 1900 wherein gate electrodes of further transistors and/or electrically conductive lines (not shown) are to be formed.

For forming the hardmask 1905, a layer of a hardmask material similar to the layer 603 of hardmask material described above with reference to FIG. 6 may be deposited over the layer 602 of gate electrode material. Then, a mask 1904 may be formed over the layer of hardmask material, and an etch process adapted to remove the material of the layer of hardmask material may be performed. Thus, the layer of hardmask material may be patterned, wherein the hardmask 1905 is formed. In the etch process used for patterning the layer of hardmask material, portions of the layer of hardmask material over the logic transistor region 102, the ferroelectric transistor region 103 and the input/output transistor region 104 which are not covered by the mask 1904 may be removed in a common etch process.

Figure 20:
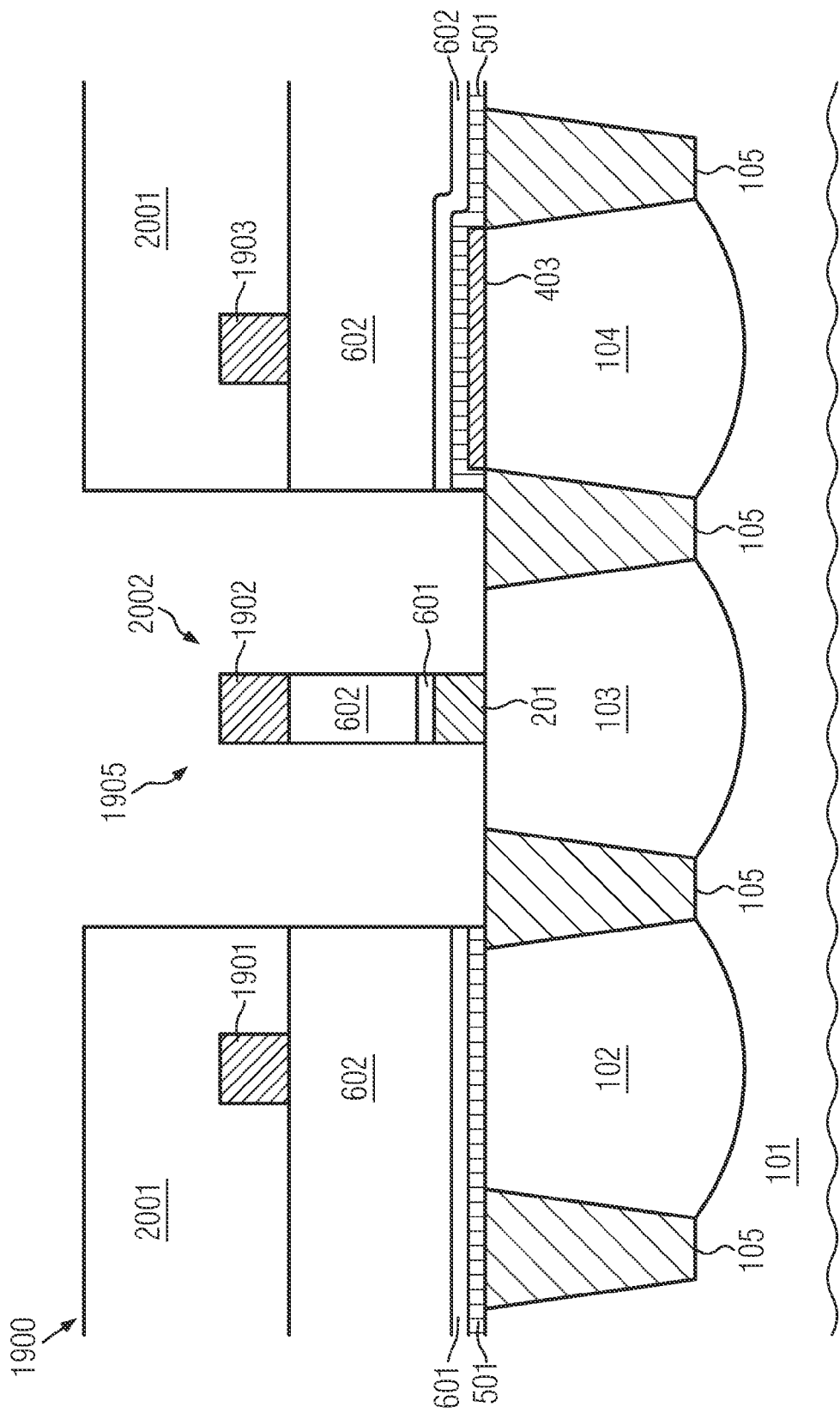

FIG. 20 shows a schematic cross-sectional view of the semiconductor structure 1900 in a later stage of the manufacturing process. After the formation of the hardmask 1905, the mask 1904 may be removed. Thereafter, a first etch decoupling mask 2001 may be formed over the semiconductor structure 1900. The first etch decoupling mask 2001 may be provided over the logic transistor region 102 and the input/output transistor region 104, but not over the ferroelectric transistor region 103. In some embodiments, the first etch decoupling mask 2001 may be a photoresist mask, and it may be formed by means of a photolithography process.

In other embodiments, the first etch decoupling mask 2001 may be a hardmask that is formed from a different material than the hardmask 1905, so that the material of the first etch decoupling mask 2001 may be etched selectively with respect to the material of the hardmask 1905. In some embodiments wherein the first etch decoupling mask 2001 is a hardmask, the first etch decoupling mask 2001 may be formed of amorphous carbon. In such embodiments, the material of the first etch decoupling mask 2001 may be deposited by means of CVD. In other embodiments wherein the first etch decoupling mask 2001 is a hardmask, the first etch decoupling mask 2001 may be formed from a layer of a spin-on carbon material. The layer of the material from which the first etch decoupling mask 2001 is formed may then be patterned. In some embodiments, this may be done by means of a litho-only approach, wherein a photoresist mask is formed on the layer from which the first etch decoupling mask 2001 is formed, and then an etch process is performed for patterning the layer. In other embodiments, a known tri-layer pattern transfer process may be employed.

After the formation of the first etch decoupling mask 2001, one or more etch processes may be performed for removing portions of the layer 602 of gate electrode material, the metal 601 and the ferroelectric transistor dielectric 201 which are covered neither by the portion 1902 of the hardmask 1905 nor by the first etch decoupling mask 2001. In some embodiments, separate etch processes may be employed for removing portions of the layer 602 of gate electrode material and portions of the ferroelectric transistor dielectric 201, as described above with reference to FIG. 7.

Due to the removal of portions of the layer 602 of gate electrode material, the second metal 601 and the ferroelectric transistor dielectric 201 which are covered neither by the portion 1902 of the hardmask 1905 nor by the first etch decoupling mask 2001, a gate electrode structure 2002 of a ferroelectric transistor is formed over the ferroelectric transistor region 103.

Figure 21:
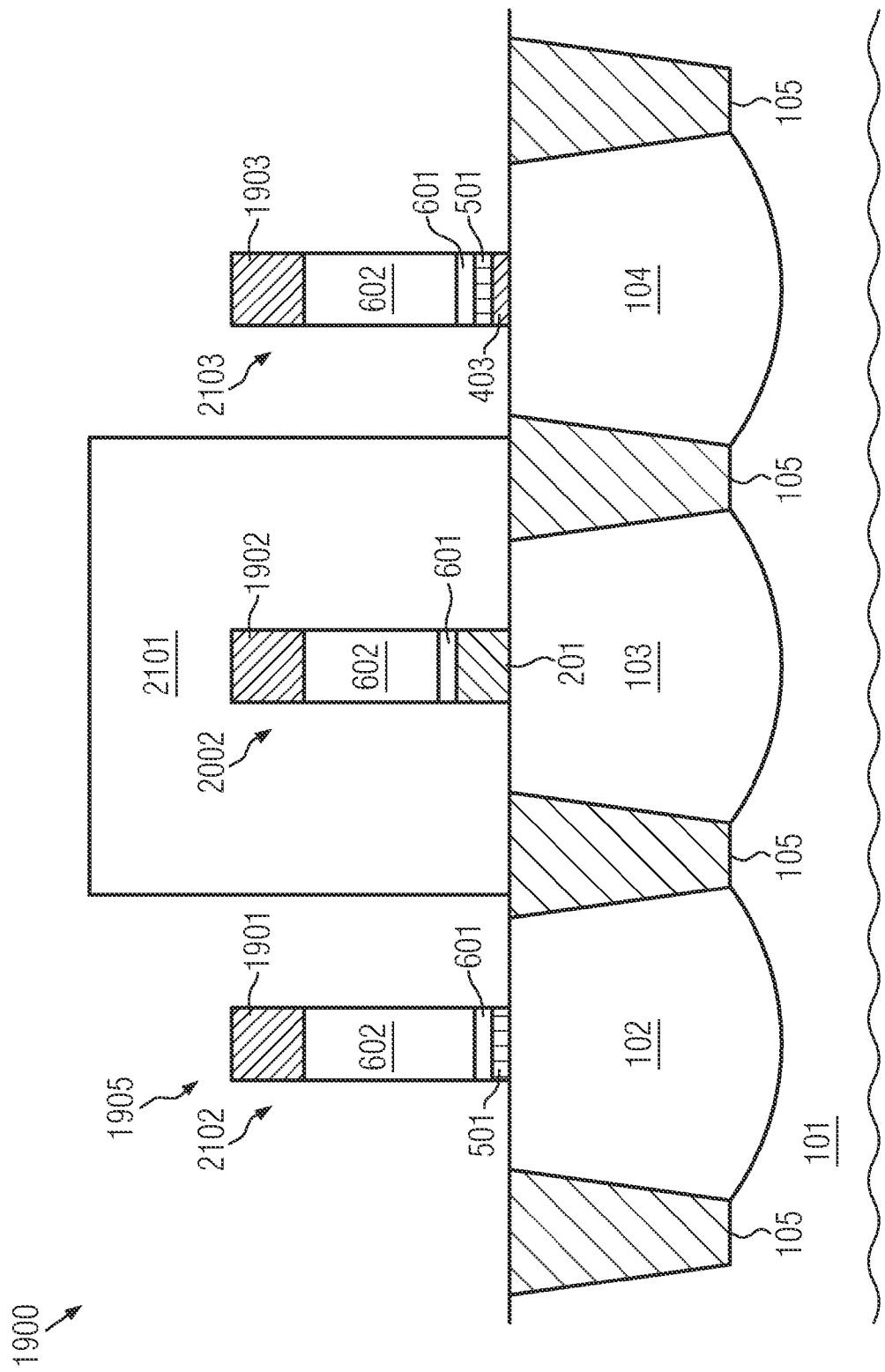

FIG. 21 shows a schematic cross-sectional view of the semiconductor structure 1900 in a later stage of the manufacturing process. After the formation of the gate electrode 2002 over the ferroelectric transistor region 103, the first etch decoupling mask 2001 may be removed. In embodiments wherein the first etch decoupling mask 2001 is a photoresist mask, this may be done by means of a resist strip process. In embodiments wherein the first etch decoupling mask 2001 is a hardmask, the removal of the first etch decoupling mask 2001 may be performed by means of an etch process adapted to selectively remove the material of the first etch decoupling mask 2001 relative to the other materials of the semiconductor structure 1900.

Thereafter, a second etch decoupling mask 2101 may be formed. The second etch decoupling mask 2101 may be provided over the ferroelectric transistor region 103 but not over the logic transistor region 102 and the input/output transistor region 104. Features of the second etch decoupling mask 2101 may correspond to those of the first etch decoupling mask 2001, and corresponding methods may be employed for the formation thereof.

Thereafter, one or more etch processes may be performed for removing portions of the layer 602 of gate electrode material, the metal 601, the logic transistor dielectric 501 and the input/output transistor dielectric 403 which are covered neither by the second etch decoupling mask 2101 nor by the portions 1902, 1903 of the hardmask 1905. Thus, a gate electrode structure 2102 of a logic transistor is formed over the logic transistor region 102, and a gate electrode 2103 of an input/output transistor is formed over the input/output transistor region 104.

The present disclosure is not limited to embodiments wherein, first, the gate electrode 2002 of the ferroelectric transistor is formed and, then, the gate electrodes 2102, 2103 of the logic transistor and the input/output transistor are formed. In other embodiments, the first etch decoupling mask 2001 may be provided over the ferroelectric transistor region 103, but not over the logic transistor region 102 and the input/output transistor region 104, and the gate electrodes 2102, 2103 of the logic transistor and the input/output transistor may be formed by means of one or more etch processes. Then, the first etch decoupling mask 2001 may be removed, and the second etch decoupling mask 2101 may be formed over the logic transistor region 102 and the input/output transistor region 104. Then, the gate electrode 2002 of the ferroelectric transistor may be formed by means of one or more etch processes. Thus, the gate electrodes 2102, 2103 of the logic transistor and the input/output transistor may be formed before the formation of the gate electrode 2002 of the ferroelectric transistor.

In some embodiments, the gate electrodes formed over the logic transistor region 102, the ferroelectric transistor region 103 and the input/output transistor region 104 in the embodiments described above with reference to FIGS. 1-21 may be final gate electrodes of a logic transistor, a ferroelectric transistor and an input/output transistor, respectively. In other embodiments, they may be dummy gate electrodes, and they may be replaced with final gate electrodes by means of known replacement gate processes in later processing steps.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing a semiconductor structure comprising a logic transistor region, a ferroelectric transistor region and an input/output transistor region;
    forming a first protection layer over said semiconductor structure, said first protection layer covering said logic transistor region and said input/output transistor region, at least a portion of said ferroelectric transistor region not being covered by said first protection layer;
    after forming said first protection layer, forming a recess in said ferroelectric transistor region by performing an etch process adapted to remove a semiconductor material of said ferroelectric transistor region;
    after said etch process, performing an oxidation process adapted to oxidize said semiconductor material of said ferroelectric transistor region and performing a wet etch adapted to remove an oxide formed in said oxidation process; and
    depositing a ferroelectric transistor dielectric over said semiconductor structure, wherein a portion of said ferroelectric transistor dielectric is deposited in said recess, removing said ferroelectric transistor dielectric and said first protection layer from said logic transistor region and said input/output transistor region, forming an input/output transistor dielectric over said input/output transistor region, and forming a logic transistor dielectric over at least said logic transistor region.

2. The method of claim 1, wherein the formation of said input/output transistor dielectric comprises:
    forming said input/output transistor dielectric over at least said input/output transistor region and said logic transistor region; and
    removing said input/output transistor dielectric from at least said logic transistor region.

3. The method of claim 2, further comprising, after removing said input/output transistor dielectric from at least said logic transistor region, depositing a logic transistor dielectric over said semiconductor structure and depositing a first metal over said logic transistor dielectric.

4. The method of claim 3, further comprising:
    after removing said ferroelectric transistor dielectric and said first protection layer from said ferroelectric transistor region, depositing a second protection layer over said semiconductor structure; and
    removing portions of said second protection layer over said logic transistor region and said input/output transistor region, a portion of said second protection layer covering said ferroelectric transistor region remaining in said semiconductor structure;
    wherein said input/output transistor dielectric is formed after said removing portions of said second protection layer over said logic transistor region and said input/output transistor region.

5. The method of claim 4, wherein said logic transistor dielectric and said first metal are removed from said ferroelectric transistor region together with a portion of said second protection layer over said ferroelectric transistor region.

6. The method of claim 5, further comprising, after removing said portion of said second protection layer over said ferroelectric transistor region, said first metal and said logic transistor dielectric from said ferroelectric transistor region, removing said first metal from said logic transistor region and said input/output transistor region, depositing a second metal over said semiconductor structure and depositing a layer of a semiconductor material over said semiconductor structure.

7. The method of claim 6, further comprising, before the formation of said first protection layer, forming a pad layer over said logic transistor region, said ferroelectric transistor region and said input/output transistor region.

8. The method of claim 7, wherein, in the removal of said first protection layer from said ferroelectric transistor region, said pad layer is used as an etch stop layer.

9. The method of claim 8, wherein, in the removal of said first protection layer from said logic transistor region and said input/output transistor region, said pad layer is used as an etch stop layer.

10. The method of claim 9, wherein said ferroelectric transistor dielectric comprises a layer of silicon-doped hafnium dioxide.

11. The method of claim 1, wherein said recess is entirely filled with said ferroelectric transistor dielectric.

12. The method of claim 1, further comprising performing one or more ion implantation processes for forming a doped well region in each of said logic transistor region, said ferroelectric transistor region and said input/output transistor region, wherein said one or more ion implantation processes are performed after said oxidation process.

13. The method of claim 11, wherein the formation of said recess comprises performing an oxidation process adapted to oxidize a semiconductor material of said ferroelectric transistor region and performing an etch process adapted to remove an oxide formed in said oxidation process, wherein substantially all of said semiconductor material of said ferroelectric transistor region that is removed in the formation of said recess is oxidized in said oxidation process.

14. The method of claim 13, further comprising performing one or more ion implantation processes for forming a doped well region in each of said logic transistor region, said ferroelectric transistor region and said input/output transistor region, wherein said one or more ion implantation processes are performed after said oxidation process.

15. The method of claim 14, wherein said etch process adapted to remove said oxide is performed before said one or more ion implantation processes.

16. The method of claim 4, wherein said etch process adapted to remove said oxide is performed after said one or more ion implantation processes.

17. The method of claim 1, further comprising:
    forming a first gate electrode over said ferroelectric transistor region;
    forming a second gate electrode over said logic transistor region; and
    forming a third gate electrode over said input/output transistor region.

18. The method of claim 17, further comprising:
    depositing a layer of a gate electrode material over said semiconductor structure;
    wherein the formation of said first gate electrode comprises performing a first gate etch process adapted to remove said gate electrode material, said first gate etch process partially removing a portion of said layer of gate electrode material over said ferroelectric transistor region; and wherein the formation of said second gate electrode and said third gate electrode comprises performing a second gate etch process, said second gate etch process partially removing a portion of said layer of gate electrode material over said logic transistor region and a portion of said layer of gate electrode material over said input/output transistor region;

said first gate etch process and said second gate etch process being separate etch processes.

19. The method of claim 18, further comprising:
depositing a layer of a hardmask material over said semiconductor structure;
patterning said layer of hardmask material to form a hardmask from said layer of hardmask material, said hardmask comprising a first portion over said ferroelectric transistor region defining said first gate electrode, a second portion over said logic transistor region defining said second gate electrode and a third portion over said input/output transistor region defining said third gate electrode, said first gate etch process and said second gate etch process being performed in the presence of said hardmask.

20. The method of claim 19, wherein said patterning of said layer of hardmask material comprises removing portions of said layer of hardmask material over said ferroelectric transistor region, said logic transistor region and said input/output transistor region in a common hardmask etch process.

21. The method of claim 20, further comprising:
forming a first etch decoupling mask over said semiconductor structure, said first etch decoupling mask covering said logic transistor region and said input/output transistor region but not said ferroelectric transistor region, said first gate etch process being performed in the presence of said first etch decoupling mask;
removing said first etch decoupling mask after said first gate etch process;
forming a second etch decoupling mask over said semiconductor structure, said second etch decoupling mask covering said ferroelectric transistor region but not said logic transistor region and said input/output transistor region, said second gate etch process being performed in the presence of said second etch decoupling mask; and
removing said second etch decoupling mask after said second gate etch process.

22. The method of claim 21, wherein said first gate etch process is performed before said second gate etch process.

23. The method of claim 21, wherein said second gate etch process is performed before said first gate etch process.

24. A method, comprising:
providing a semiconductor structure comprising a logic transistor region, a ferroelectric transistor region and an input/output transistor region;
forming a recess in said ferroelectric transistor region by performing an etch process adapted to remove a semiconductor material of said ferroelectric transistor region;
after said etch process, performing an oxidation process adapted to oxidize said semiconductor material of said ferroelectric transistor region and performing a wet etch process adapted to remove an oxide formed in said oxidation process;
depositing a ferroelectric transistor dielectric over said semiconductor structure, a portion of said ferroelectric transistor dielectric being deposited in said recess;
removing said ferroelectric transistor dielectric from said logic transistor region and said input/output transistor region;
forming an input/output transistor dielectric over said input/output transistor region; and
forming a logic transistor dielectric over at least said logic transistor region.

25. The method of claim 24, wherein said recess is entirely filled with said ferroelectric transistor dielectric.

26. The method of claim 24, further comprising performing one or more ion implantation processes for forming a doped well region in each of said logic transistor region, said ferroelectric transistor region and said input/output transistor region, wherein said one or more ion implantation processes are performed after said oxidation process.

27. The method of claim 25, wherein the formation of said recess comprises performing an oxidation process adapted to oxidize a semiconductor material of said ferroelectric transistor region and performing an etch process adapted to remove an oxide formed in said oxidation process, wherein substantially all of said semiconductor material of said ferroelectric transistor region that is removed in the formation of said recess is oxidized in said oxidation process.

28. The method of claim 27, further comprising performing one or more ion implantation processes for forming a doped well region in each of said logic transistor region, said ferroelectric transistor region and said input/output transistor region, wherein said one or more ion implantation processes are performed after said oxidation process.

29. The method of claim 28, wherein said etch process adapted to remove said oxide is performed before said one or more ion implantation processes.

30. The method of claim 28, wherein said etch process adapted to remove said oxide is performed after said one or more ion implantation processes.

31. The method of claim 24, wherein said input/output transistor dielectric and said logic transistor dielectric are formed after the removal of said ferroelectric transistor dielectric from said logic transistor region and said input/output transistor region, and wherein the method further comprises:
before the formation of said recess in said ferroelectric transistor region, forming a protection layer over said semiconductor structure, said protection layer covering said logic transistor region and said input/output transistor region but not said ferroelectric transistor region.

32. The method of claim 24, wherein said input/output transistor dielectric and said logic transistor dielectric are formed before the formation of said recess in said ferroelectric transistor region.

33. The method of claim 32, further comprising, after the formation of said input/output transistor dielectric and said logic transistor dielectric and before the formation of said recess in said ferroelectric transistor region, forming a masking layer over said semiconductor structure, said masking layer covering said input/output transistor region and said logic transistor region but not said ferroelectric transistor region.

34. The method of claim 32, further comprising:
after the formation of said input/output transistor dielectric and said logic transistor dielectric and before the formation of said recess in said ferroelectric transistor region, forming a protection layer over said semiconductor structure, said protection layer covering said input/output transistor region and said logic transistor region but not said ferroelectric transistor region;

wherein the deposition of said ferroelectric transistor dielectric and the removal of said ferroelectric transistor dielectric from said logic transistor region and said input/output transistor region are performed in the presence of said protection layer.

35. A method, comprising:
providing a semiconductor structure comprising a logic transistor region, a ferroelectric transistor region and an input/output transistor region;
forming a first protection layer over said semiconductor structure, said first protection layer covering said logic transistor region and said input/output transistor region, at least a portion of said ferroelectric transistor region not being covered by said first protection layer;
after forming said first protection layer, forming a recess in said ferroelectric transistor region; and
depositing a ferroelectric transistor dielectric over said semiconductor structure, wherein said ferroelectric transistor dielectric entirely fills said recess, removing said ferroelectric transistor dielectric and said first protection layer from said logic transistor region and said input/output transistor region, forming an input/output transistor dielectric over said input/output transistor region, and forming a logic transistor dielectric over at least said logic transistor region.

36. The method of claim 35, wherein the formation of said input/output transistor dielectric comprises:
forming said input/output transistor dielectric over at least said input/output transistor region and said logic transistor region;
removing said input/output transistor dielectric from at least said logic transistor region; and
depositing a logic transistor dielectric over said semiconductor structure and depositing a first metal over said logic transistor dielectric.

37. The method of claim 36, further comprising:
after removing said ferroelectric transistor dielectric and said first protection layer from said ferroelectric transistor region, depositing a second protection layer over said semiconductor structure; and
removing portions of said second protection layer over said logic transistor region and said input/output transistor region, a portion of said second protection layer covering said ferroelectric transistor region remaining in said semiconductor structure;
wherein said input/output transistor dielectric is formed after said removing portions of said second protection layer over said logic transistor region and said input/output transistor region.

38. The method of claim 37, wherein said logic transistor dielectric and said first metal are removed from said ferroelectric transistor region together with a portion of said second protection layer over said ferroelectric transistor region.

39. The method of claim 38, further comprising, after removing said portion of said second protection layer over said ferroelectric transistor region, said first metal and said logic transistor dielectric from said ferroelectric transistor region, removing said first metal from said logic transistor region and said input/output transistor region, depositing a second metal over said semiconductor structure and depositing a layer of a semiconductor material over said semiconductor structure.

40. The method of claim 35, further comprising, before the formation of said first protection layer, forming a pad layer over said logic transistor region, said ferroelectric transistor region and said input/output transistor region, wherein, in the removal of said first protection layer from one of said ferroelectric transistor region, said logic transistor region, or said input/output transistor region, said pad layer is used as an etch stop layer.

41. The method of claim 35, wherein the formation of said recess comprises performing an oxidation process adapted to oxidize a semiconductor material of said ferroelectric transistor region and performing an etch process adapted to remove an oxide formed in said oxidation process, wherein substantially all of said semiconductor material of said ferroelectric transistor region that is removed in the formation of said recess is oxidized in said oxidation process.

42. The method of claim 35, further comprising:
depositing a layer of a gate electrode material over said semiconductor structure;
performing a first gate etch process to remove said gate electrode material, said first gate etch process partially removing a portion of said layer of gate electrode material over said ferroelectric transistor region to form a first gate electrode over said ferroelectric transistor region; and
a second gate etch process to partially remove a portion of said layer of gate electrode material over said logic transistor region to form a second gate electrode over said logic transistor region and to remove a portion of said layer of gate electrode material over said input/output transistor region to form a third gate electrode over said input/output transistor region, wherein said first gate etch process and said second gate etch process are separate etch processes.

43. The method of claim 42, further comprising:
depositing a layer of a hardmask material over said semiconductor structure;
patterning said layer of hardmask material to form a hardmask from said layer of hardmask material, said hardmask comprising a first portion over said ferroelectric transistor region defining said first gate electrode, a second portion over said logic transistor region defining said second gate electrode and a third portion over said input/output transistor region defining said third gate electrode, said first gate etch process and said second gate etch process being performed in the presence of said hardmask.

44. The method of claim 43, wherein said patterning of said layer of hardmask material comprises removing portions of said layer of hardmask material over said ferroelectric transistor region, said logic transistor region and said input/output transistor region in a common hardmask etch process.

45. The method of claim 44, further comprising:
forming a first etch decoupling mask over said semiconductor structure, said first etch decoupling mask covering said logic transistor region and said input/output transistor region but not said ferroelectric transistor region, said first gate etch process being performed in the presence of said first etch decoupling mask;
removing said first etch decoupling mask after said first gate etch process;
forming a second etch decoupling mask over said semiconductor structure, said second etch decoupling mask covering said ferroelectric transistor region but not said logic transistor region and said input/output transistor region, said second gate etch process being performed in the presence of said second etch decoupling mask; and
removing said second etch decoupling mask after said second gate etch process.

* * * * *